United States Patent
Aoki et al.

(10) Patent No.: US 12,170,293 B2
(45) Date of Patent: Dec. 17, 2024

(54) ARRAY SUBSTRATE, DISPLAY DEVICE, AND METHOD OF PRODUCING ARRAY SUBSTRATE

(71) Applicant: Sharp Display Technology Corporation, Kameyama (JP)

(72) Inventors: Tomohisa Aoki, Kameyama (JP); Tsuyoshi Itoh, Kameyama (JP); Tohru Sakata, Kameyama (JP); Miho Yamada, Tsu (JP); Kohichi Kumagai, Tsu (JP)

(73) Assignee: Sharp Display Technology Corporation, Kameyama (JP)

( * ) Notice: Subject to any disclaimer, the term of this patent is extended or adjusted under 35 U.S.C. 154(b) by 114 days.

(21) Appl. No.: 17/974,519

(22) Filed: Oct. 27, 2022

(65) Prior Publication Data

US 2023/0140018 A1 May 4, 2023

(30) Foreign Application Priority Data

Oct. 29, 2021 (JP) .................................. 2021-177443

(51) Int. Cl.

| | |
|---|---|
| *H01L 27/12* | (2006.01) |
| *G02F 1/1343* | (2006.01) |
| *G02F 1/1362* | (2006.01) |
| *G02F 1/1368* | (2006.01) |

(52) U.S. Cl.
CPC .... *H01L 27/1248* (2013.01); *G02F 1/134363* (2013.01); *G02F 1/13439* (2013.01); *G02F 1/136227* (2013.01); *H01L 27/1288* (2013.01); *G02F 1/134318* (2021.01); *G02F 1/1368* (2013.01); *H01L 27/1244* (2013.01)

(58) Field of Classification Search
CPC ........... H01L 27/1248; G02F 1/134363; G02F 1/13439; G02F 1/136227

See application file for complete search history.

(56) References Cited

U.S. PATENT DOCUMENTS

| | | | |
|---|---|---|---|
| 2002/0008819 A1 | 1/2002 | Yoshida | |
| 2018/0045993 A1* | 2/2018 | Miyamoto | .......... G02F 1/13439 |

FOREIGN PATENT DOCUMENTS

| | | | |
|---|---|---|---|
| JP | 2001-311963 A | 11/2001 | |
| JP | 2009-036947 A | 2/2009 | |

\* cited by examiner

*Primary Examiner* — Lucy P Chien
(74) *Attorney, Agent, or Firm* — ScienBiziP, P.C.

(57) ABSTRACT

An array substrate includes a thin film transistor including a drain electrode, a first insulation film included in an upper layer than the drain electrode and including a contact hole overlapping the drain electrode, a pixel electrode included in an upper layer than the first insulation film and overlaps the drain electrode at least inside the contact hole and is connected to the drain electrode, a second insulation film included in an upper layer than the pixel electrode and overlaps the pixel electrode inside the contact hole and extends outside the contact hole, a conductive portion included in an upper layer than the second insulation film and overlaps the pixel electrode at least inside the contact hole, and an insulation portion included in an upper layer than the pixel electrode and in a lower layer than the conductive portion and overlaps the pixel electrode inside the contact hole.

12 Claims, 17 Drawing Sheets

ARRAY SUBSTRATE, DISPLAY DEVICE, AND METHOD OF PRODUCING ARRAY SUBSTRATE

CROSS REFERENCE TO RELATED APPLICATION

This application claims priority from Japanese Patent Application No. 2021-177443 filed on Oct. 29, 2021. The entire contents of the priority application are incorporated herein by reference.

TECHNICAL FIELD

The present technology described herein relates to an array substrate, a display device, and a method of producing the array substrate.

BACKGROUND

A first example of known liquid crystal display devices includes a first insulating substrate, switching components that disposed adjacent to intersections of scanning lines and signal lines, an insulating layer covering the switching components, contact holes that are through the insulating layer, a matrix array substrate, an opposed substrate, and a liquid crystal layer. The matrix array substrate includes pixel electrodes that are electrically connected to the switching components via the contact holes. The liquid crystal layer is disposed between the matrix array substrate and the opposed substrate. Planarization layers are disposed in the contact holes for planarization.

In a second example of the known liquid crystal display devices, on a component substrate, thin film transistors, an interlayer insulating film, pixel electrodes, an electrode in-between insulating film, and a common electrode are disposed on top of each other. The pixel electrodes are electrically connected to the thin film transistors via contact holes formed in the interlayer insulating film and drain electrodes. The common electrode includes slits (openings). The contact holes are filled with a in-hole insulating film that is included in an upper layer than the pixel electrodes. The in-hole insulating film is an insulating film that is formed simultaneously with the electrode in-between insulating film. The in-hole insulating film is obtained as follows. Liquid is obtained by dissolving and dispersing poly silazane in a solvent and the hole insulating film is obtained by disposing the liquid on an object and baking.

In the liquid crystal display device of the first example, the matrix array substrate includes the pixel electrodes and the opposed substrate includes an opposed electrode. In the liquid crystal display device of the second example, the component substrate includes the pixel electrodes and the common electrode. In the liquid crystal display device of the second example, the common electrode has openings in sections overlapping the contact holes. Therefore, even if breakage is caused in the electrode in-between insulating film, which insulates the pixel electrodes from the common electrode, a short-circuit is less likely to be caused between the pixel electrodes and the common electrode. However, if a structural object having electrically conductive properties is required to be disposed to overlap the contact hole and a breakage is caused in the electrode in-between insulating film, the short-circuit may be caused between the structural object and the pixel electrodes.

SUMMARY

The technology described herein was made in view of the above circumstances. An object is to suppress occurrence of a short-circuit.

An array substrate according to the technology described herein includes a thin film transistor at least including a drain electrode, a first insulation film, a pixel electrode, a second insulation film, a conductive portion, and an insulation portion. The first insulation film is included in an upper layer than the drain electrode and includes a contact hole in a portion of the first insulation film overlapping the drain electrode. The pixel electrode is included in an upper layer than the first insulation film and overlaps the drain electrode at least inside the contact hole and is connected to the drain electrode. The second insulation film is included in an upper layer than the pixel electrode and overlaps the pixel electrode inside the contact hole and extends outside the contact hole. The conductive portion is included in an upper layer than the second insulation film and overlaps the pixel electrode at least inside the contact hole. The insulation portion is included in an upper layer than the pixel electrode and in a lower layer than the conductive portion and overlaps the pixel electrode inside the contact hole.

A method of producing an array substrate according to the technology described herein includes steps of disposing a first conductive film and providing a drain electrode of a thin film transistor by patterning the first conductive film, disposing a first insulation film on an upper layer-side of the first conductive film and forming a contact hole in a portion of the first insulation film overlapping the drain electrode by patterning the first insulation film and, disposing a second conductive film on an upper layer-side of the first insulation film and providing a pixel electrode by patterning the second conductive film such that the pixel electrode overlaps the drain electrode at least inside the contact hole and is connected to the drain electrode, disposing a second insulation film on an upper layer-side of the second conductive film such that the second insulation film overlaps the pixel electrode inside the contact hole and extending outside the contact hole, disposing a third insulation film on an upper layer-side of the second conductive film and providing an insulation portion by patterning the third insulation film such that the insulation portion overlaps the pixel electrode inside the contact hole, and disposing a third conductive film on an upper-layer side of the second insulation film and the third insulation film and providing a conductive portion by patterning the third conductive film such that the conductive portion overlaps the pixel electrode at least inside the contact hole.

According to the technology described herein, a short-circuit is less likely to occur.

DETAILED DESCRIPTION

Figure 1:
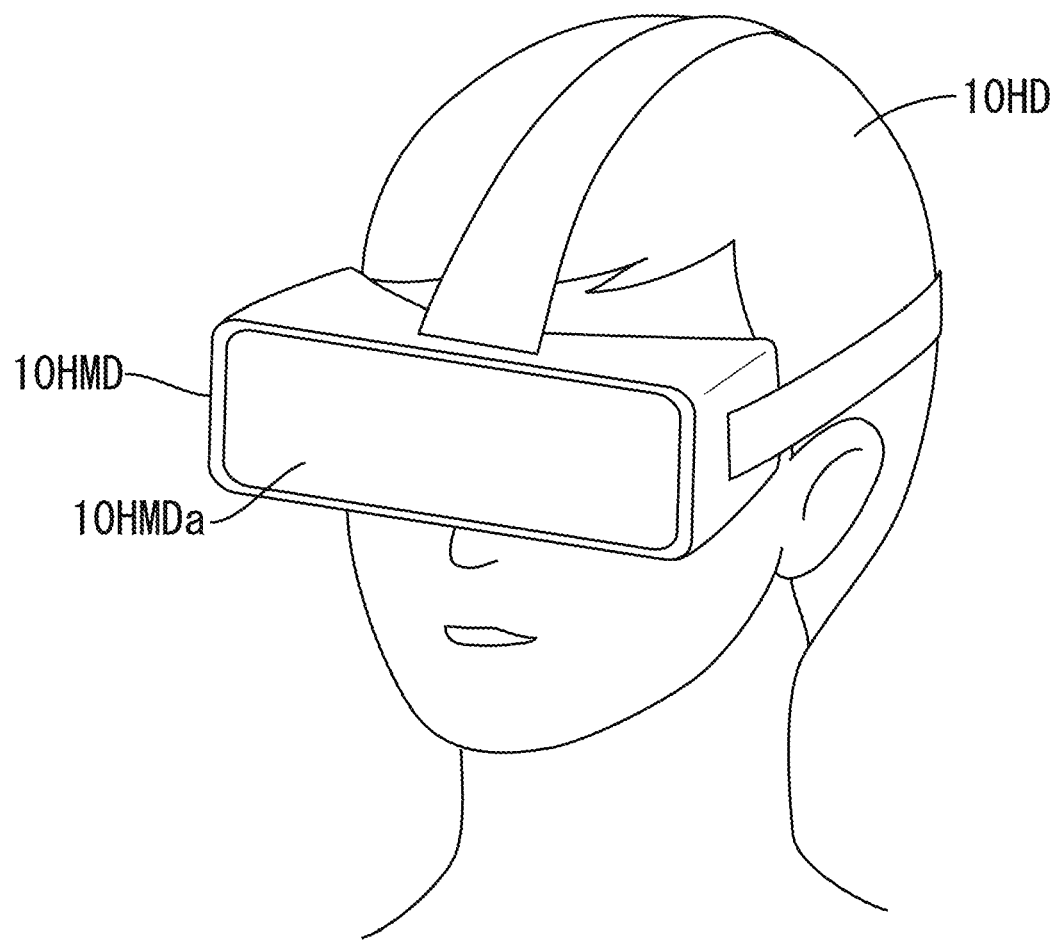
FIG. 1 is a general perspective view illustrating a head-mounted display that is mounted on a head of a user.

An embodiment will be described with reference to FIGS. 1 to 17. In this embodiment section, a goggle-type head-mounted display 10HMD (HMD) and a liquid crystal display device 10 used therein will be described as an example. X-axis, Y-axis and Z-axis may be present in the drawings and each of the axial directions represents a direction represented in each drawing.

FIG. 1 is a general perspective view illustrating the head-mounted display 10HMD that is mounted on a head 10HD of a user. As illustrated in FIG. 1, the goggle-type head-mounted display 10HMD includes a head mounting device 10HMDa that is mounted on the head 10HD of the user. The head mounting device 10HMDa covers two eyes of the user.

Figure 2:
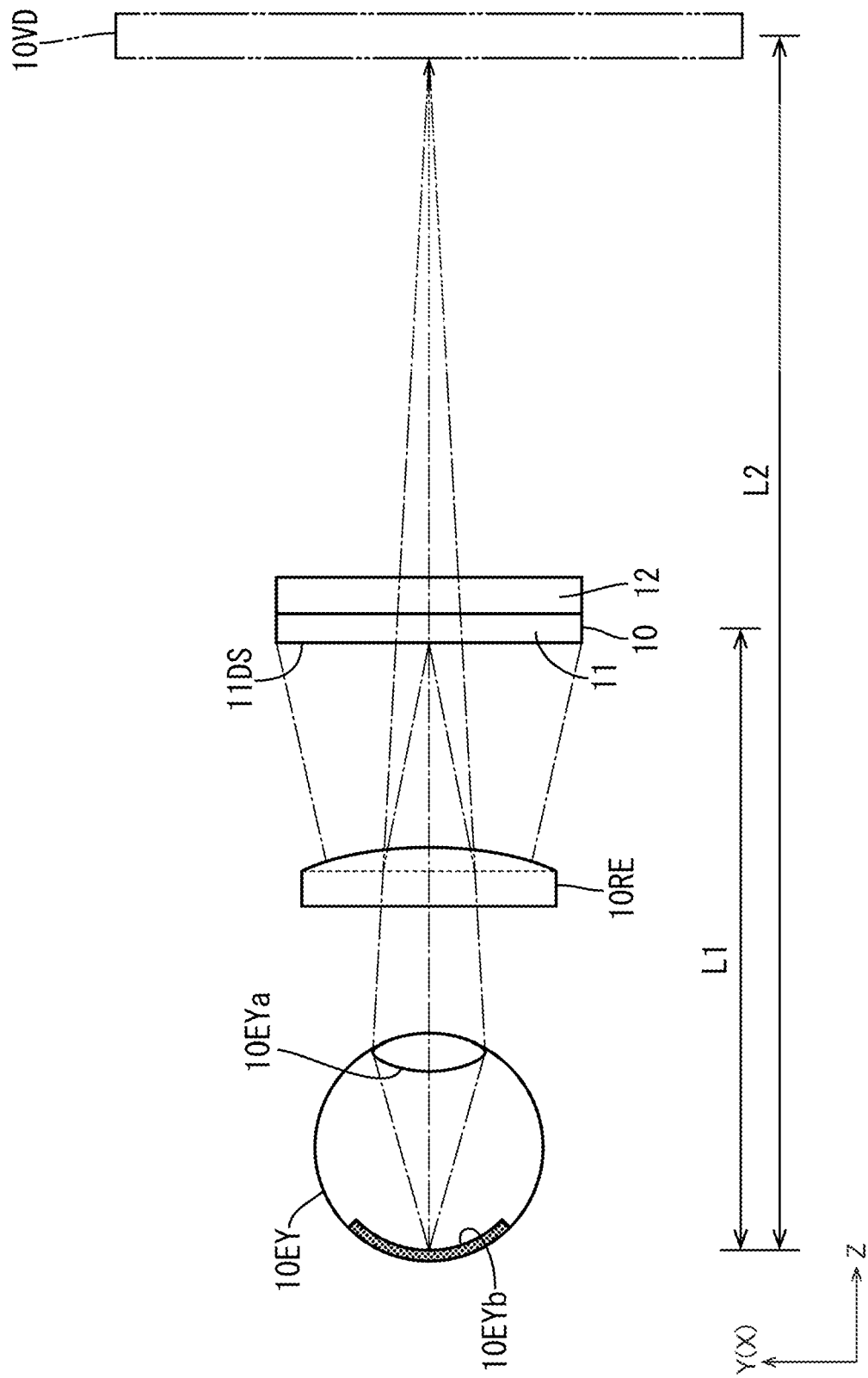
FIG. 2 is a general side view illustrating an optical relation of a liquid crystal display device and a lens that are included in a head mounting device of the head-mounted display and an eyeball of the user.

FIG. 2 is a general side view illustrating an optical relation of the liquid crystal display device 10 and a lens 10RE that are included in the head mounting device 10HMDa of the head-mounted display 10HMD and an eyeball 10EY of the user. As illustrated in FIG. 2, the head mounting device 10HMDa at least includes the built-in liquid crystal display device 10 displaying images thereon and the built-in lens 10RE with which the images displayed on the liquid crystal display device 10 are formed (imaging) on the eyeballs EY of the user. The liquid crystal display device 10 at least includes a liquid crystal panel 11 (a display device) and a backlight 12 (alighting device) that supplies light to the liquid crystal panel 11. The liquid crystal panel 11 includes a plate surface that is opposed to the lens 10RE as a display surface 11DS on which images are displayed. The lens 10RE is disposed between the liquid crystal display device 10 and the eyeballs 10EY of the user and makes the light rays transmitting therethrough to be refracted. By adjusting a focal distance of the lens 10RE, images formed on the retina (eye) 10EYb through the crystalline lens 10EYa of the eyeball 10EY are seen by a user as if the images are displayed on a virtual display 10VD that is present in appearance at a position away from the eyeball 10EY by a distance L2. The distance L2 is much greater than an actual distance L1 from the eyeball 10EY to the liquid crystal display device 10. Accordingly, the user sees a magnified image (a virtual image) displayed on the virtual display 10VD having a screen size (for example, from dozens of inches to several hundred inches) much greater than the screen size (for example, from several numbers of 0.1 inches to several inches) of the liquid crystal display device 10.

One liquid crystal display device 10 may be mounted in the head mounting device 10HMDa and images for a right eye and images for a left eye may be displayed on the liquid crystal display device 10. Two liquid crystal display devices 10 may be mounted in the head mounting device 10HMDa and images for a right eye may be displayed on one of the two liquid crystal display devices 10 and images for a left eye may be displayed on the other one of the two liquid crystal display devices 10. The head mounting device 10HMDa may include earphone that is put on user's ears and through which sounds are output.

Figure 3:
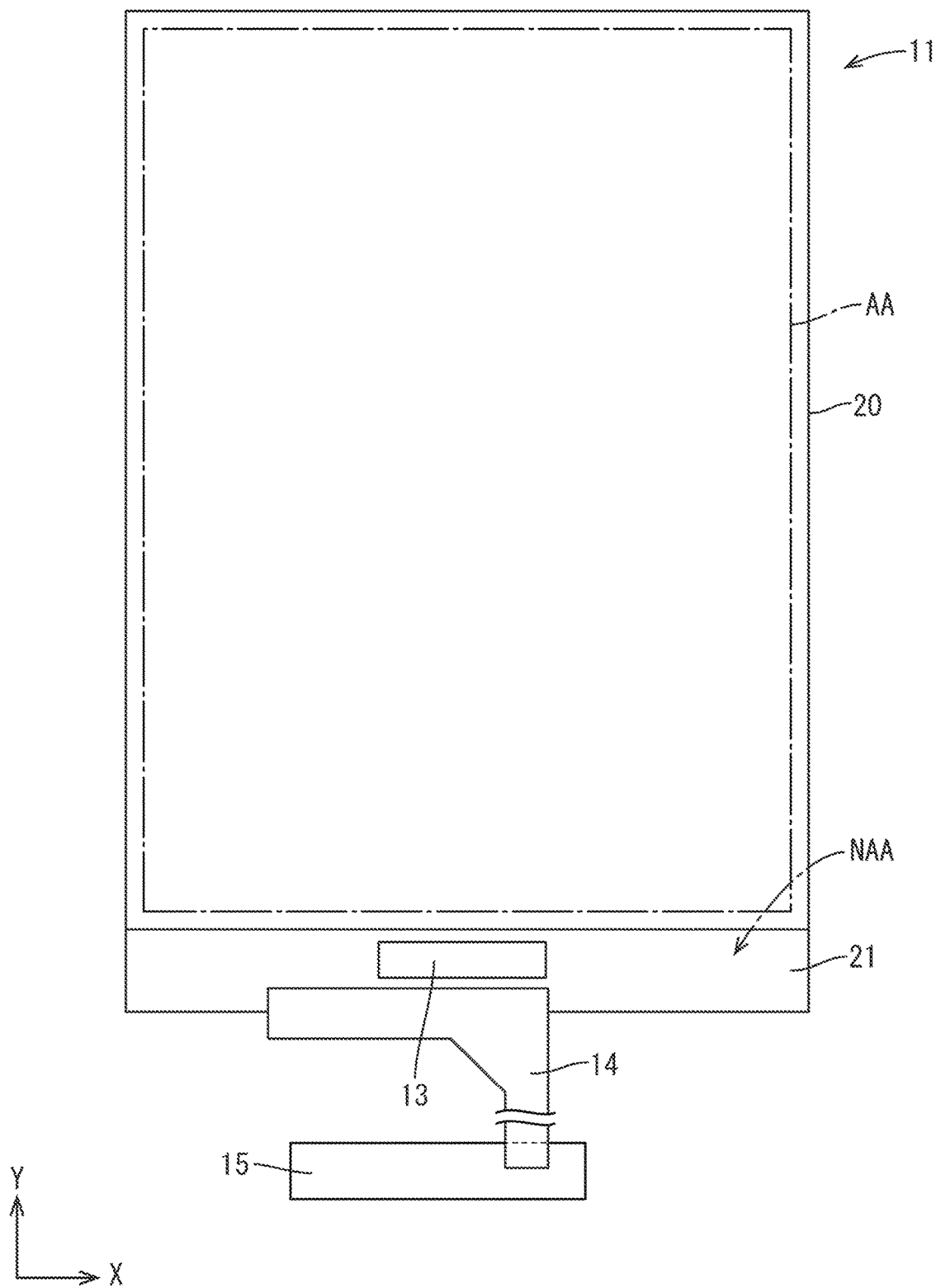
FIG. 3 is a plan view illustrating a liquid crystal panel, a flexible substrate, and a control circuit board included in the liquid crystal display device.

A configuration of the liquid crystal panel 11 included in the liquid crystal display device 10 will be described with reference to FIG. 3. FIG. 3 is a plan view illustrating the liquid crystal panel 11, a flexible substrate 14, and a control circuit board 15 included in the liquid crystal display device 10. The backlight 12 has a known configuration and includes a light source such as LEDs and optical members for converting the light from the light source into planar light by applying optical effects to the light from the light source. As illustrated in FIG. 3, a driver 13 for controlling display and the flexible substrate 14 are mounted on the liquid crystal panel 11 via an anisotropic conductive film (ACF). The flexible substrate 14 is connected to the control circuit board 15 (a signal supply source) that supplies various kinds of signals to the driver 13.

As illustrated in FIG. 3, a middle section of a screen of the liquid crystal panel 11 is configured as a display area (an active area) AA in which images are displayed. An outer section in a frame shape surrounding the display area AA in the screen of the liquid crystal panel 11 is configured as a non-display area (a non-active area) NAA in which images are not displayed. In FIG. 3, an outline of the display area AA is defined by a chain line and an area outside the chain line is the non-display area NAA. The liquid crystal panel 11 includes a pair of substrates 20, 21 that are bonded to each other. One of the substrates on the front side (a front surface side) is an opposed substrate 20 (a CF substrate) and another one on the back side (a back surface side) is an array substrate 21 (an active matrix substrate). The opposed substrate 20 and the array substrate 21 include substantially transparent glass substrates 20GS, 21GS and various films formed in layers on inner sides of the glass substrates 20GS, 21GS. Polarizing plates are attached to outer surfaces of the substrates 20 and 21.

Figure 4:
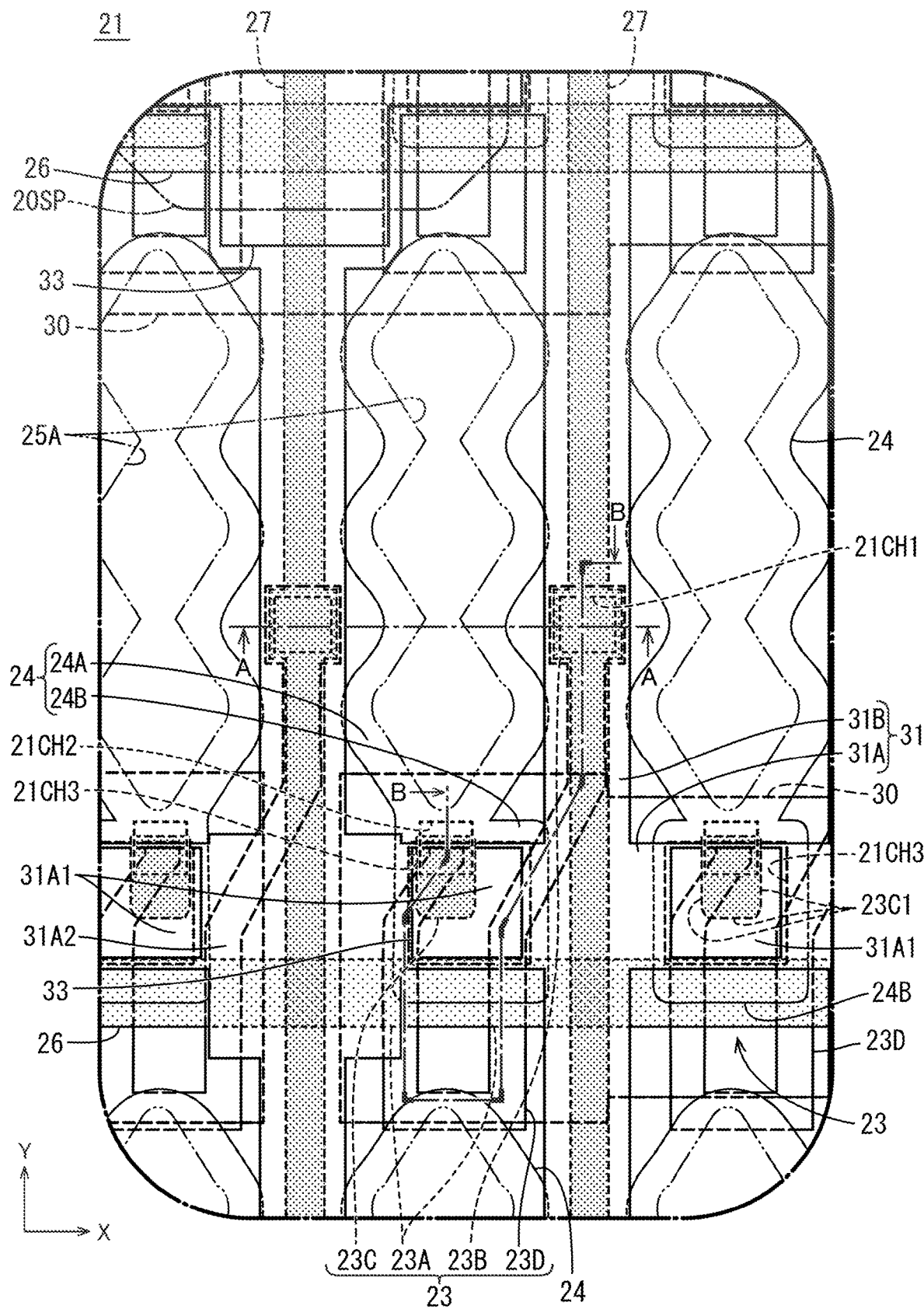
FIG. 4 is a plan view illustrating a pixel arrangement in a display area of an array substrate of the liquid crystal panel and illustrating configurations of a second metal film and a third metal film with shading.

FIG. 4 is a plan view illustrating pixel arrangement in the display area AA of the array substrate 21 of the liquid crystal panel 11. Components included in the array substrate 21 that are portions of a second metal film and a third metal film 21F5 are illustrated with different types of shading in FIG. 4. As illustrated in FIG. 4, thin film transistors (TFTs) 23, which are switching components, and pixel electrodes 24 are arranged in an area of an inner surface of the array substrate 21 in the display area AA. The TFTs 23 and the pixel electrodes 24 are arranged at intervals in a matrix along the X-axis direction and the Y-axis direction. Gate lines 26 (first lines, scanning lines) and source lines 27 (second lines, signal lines) are routed perpendicular to each other (with crossing) to surround the TFTs 23 and the pixel electrodes 24. The gate lines 26 are portions of the second metal film. The gate lines 26 extend substantially straight in a direction substantially along the X-axis direction (a first direction). The gate lines 26 are arranged at intervals in the Y-axis direction with sandwiching the pixel electrodes 24. Gate electrodes 23A are portions of the second metal film. The source lines 27 are portions of the third metal film 21F5. The source lines 27 extend in a direction substantially along the Y-axis direction (a second direction) that is perpendicular to the X-axis direction. The source lines 27 are arranged at intervals in the X-axis direction with sandwiching the pixel electrodes 24.

Figure 5:
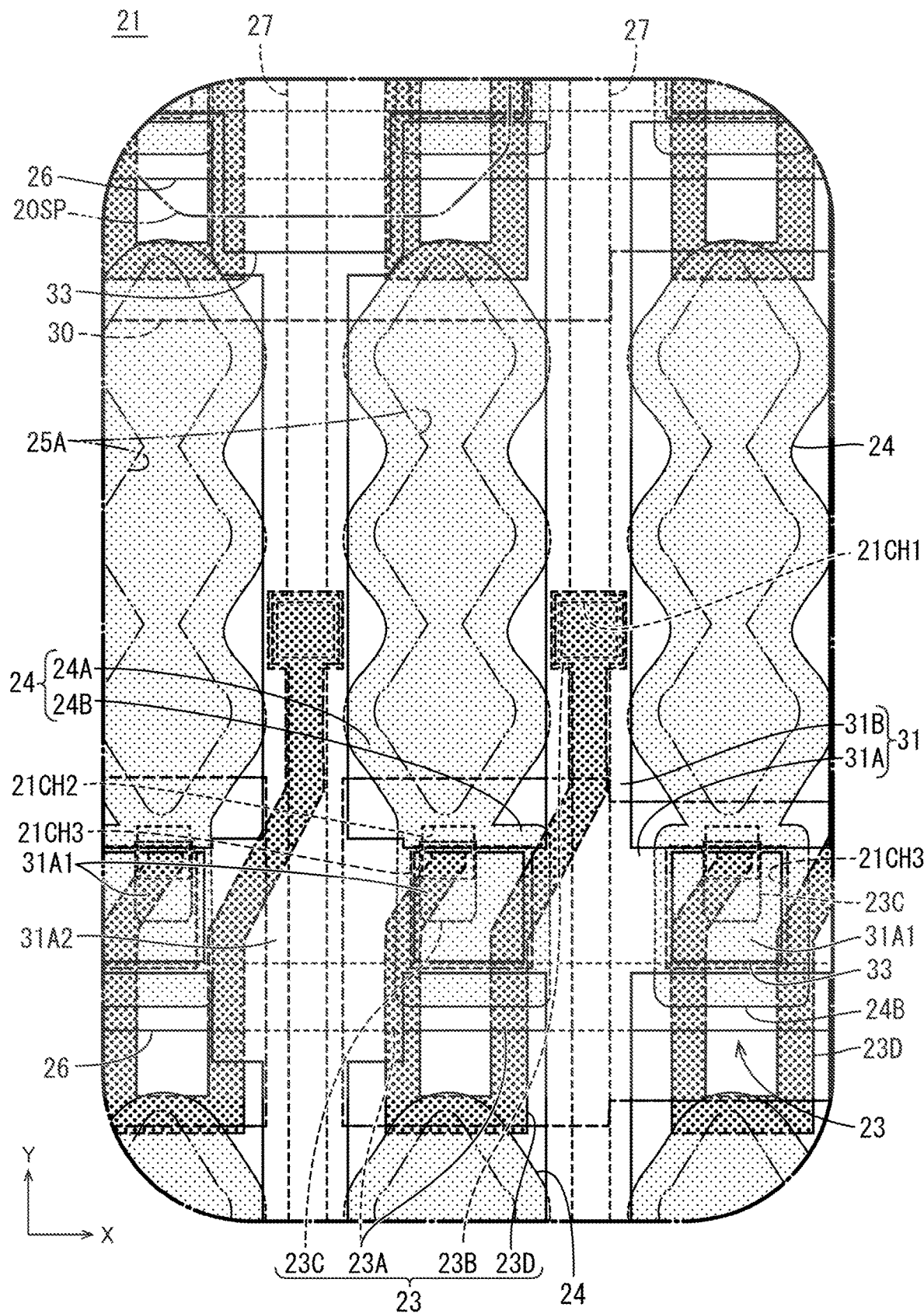
FIG. 5 is a plan view illustrating a pixel arrangement in the display area of the array substrate and illustrating configurations of a semiconductor film and a first transparent electrode film with shading.

A plan-view configuration of the TFT 23 will be described with reference to FIGS. 4 and 5. FIG. 5 is a plan view illustrating the pixel arrangement in the display area AA of the array substrate 21 similar to FIG. 4. Components included in the array substrate 21 that are portions of a semiconductor film and a first transparent electrode film 21F8 are illustrated with different types of shading in FIG. 5. As illustrated in FIGS. 4 and 5, the TFTs 23 at least include gate electrodes 23A, source electrodes 23B, drain electrodes 23C, and channels 23D. The gate electrodes 23A are portions of the gate line 26 that overlap the channels 23D. As illustrated in FIG. 4, the gate electrodes 23A and the gate lines 26 are portions of the second metal film. The source electrodes 23B are portions of the source line 27 that overlap the channels 23D and are connected to the channels 23D. The source lines 27 include wide sections and the wide sections are configured as the source electrodes 23B. The source electrodes 23B are farther away from the gate line 26 than the drain electrodes 23C are with respect to the Y-axis direction. The source electrodes 23B and the source lines 27 are portions of the third metal film 21F5. The drain electrodes 23C have a vertically-long rectangular plan-view shape and are disposed substantially at a middle between the adjacent two source lines 27 with respect to the X-axis direction. The drain electrodes 23C are connected to the pixel electrodes 24, respectively. The drain electrodes 23C and the source electrodes 23B are portions of the third metal film 21F5.

As illustrated in FIG. 5, the channels 23D are routed with being bent several times (five times) from the source electrodes 23B to the drain electrodes 23C. The channels 23D include first ends overlapping the source electrodes 23B and second ends overlapping the drain electrodes 23C. The first ends and the second ends of the channels 23D are connected to the source electrodes 23B and the drain electrodes 23C, respectively. The channels 23D include first sections that extend along the Y-axis direction and overlap the source lines 27, respectively, with a certain length from the first ends and include second sections that further extend, respectively, from the extended ends of the first sections obliquely with respect to the Y-axis direction. The channels 23D further include third sections that extend from the extended ends of the second sections, respectively, along the Y-axis direction and cross the gate lines 26. The channels 23D further include fourth sections that extend from the extended ends of the third sections, respectively, along the X-axis direction. The channels 23D further include fifth sections that extend from the extended ends of the fourth sections, respectively, along the Y-axis direction and cross the gate lines 26 again. The channels 23D further include sixth sections that extend, respectively, from the extended ends of the fifth sections obliquely with respect to the Y-axis direction. The extended ends of the sixth sections are the second ends of the channels 23D. Thus, the middle sections of the channels 23D between the first ends and the second ends include bent sections and cross the gate lines 26 twice. Therefore, the gate line 26 includes two overlapping portions that overlap one channel 23D. The gate line 26 includes two gate electrodes 23A that are connected to one channel 23D. One TFT 23 includes two gate electrodes 23A. The TFTs 23 including such a configuration turn on based on the scanning signals supplied to the gate electrodes 23A via the gate lines 26. Then, potentials related to the image signals supplied to the source electrodes 22B via the source lines 27 are transmitted to the drain electrodes 23C via the channels 23D. As a result, the pixel electrodes 24 are charged at potentials that are related to the image signals and are supplied to the drain electrodes 23C.

A plan-view configuration of the pixel electrodes 24 will be described with reference to FIG. 5. As illustrated in FIG. 5, the pixel electrodes 24 are arranged, respectively, in the areas defined by a pair of gate lines 26, which are arranged at an interval in the Y-axis direction, and a pair of source lines 27, which are arranged at an interval in the X-axis direction. The areas in which the respective pixel electrodes 24 are arranged have a substantially rectangular shape. The pixel electrodes 24 are portions of the first transparent electrode film 21F8. The pixel electrodes 24 include pixel electrode bodies 24A having an elongated shape and contact portions 24B that extend continuously from one ends of the pixel electrodes bodies 24A, respectively, with respect to the Y-axis direction. The pixel electrode bodies 24A include wide sections and narrow sections alternately from the one ends to the other ends in the Y-axis direction. The pixel electrode body 24A includes three wide sections and two recessed sections. The three wide sections have the greatest width and are away from each other in the Y-axis direction. Each of the two recessed sections is between two of the three wide sections. Most sections of the outline of the pixel electrode body 24A are curved lines and some sections of the outline are straight lines. The curved lines and the straight lines of the outline of the pixel electrode bodies 24A extend obliquely with respect to the X-axis direction and the Y-axis direction. The contact portions 24B have a vertically long plan-view shape. The contact portions 24B are positioned such that center lines thereof with respect to the X-axis direction are closer to the source lines 27 that are connected to the target TFTs 23 to be connected to the contact portions 24B than center lines of the pixel electrode bodies 24A are. The contact portions 24B are disposed to overlap entire areas of the drain electrodes 23C of the target TFTs 23, respectively. The contact portions 24B are disposed such that the contact portion 24B overlaps a portion of each of the two gate electrodes 23A of the target TFT 23 to be connected to the contact portion 24B. The contact portions 24B are disposed such that the contact portion 24B overlaps the second end (the connecting portion connected to the drain electrode 23C) and two oblique sections, which are the second section and the sixth section, of the channel 23D of the target TFT 23.

Figure 6:
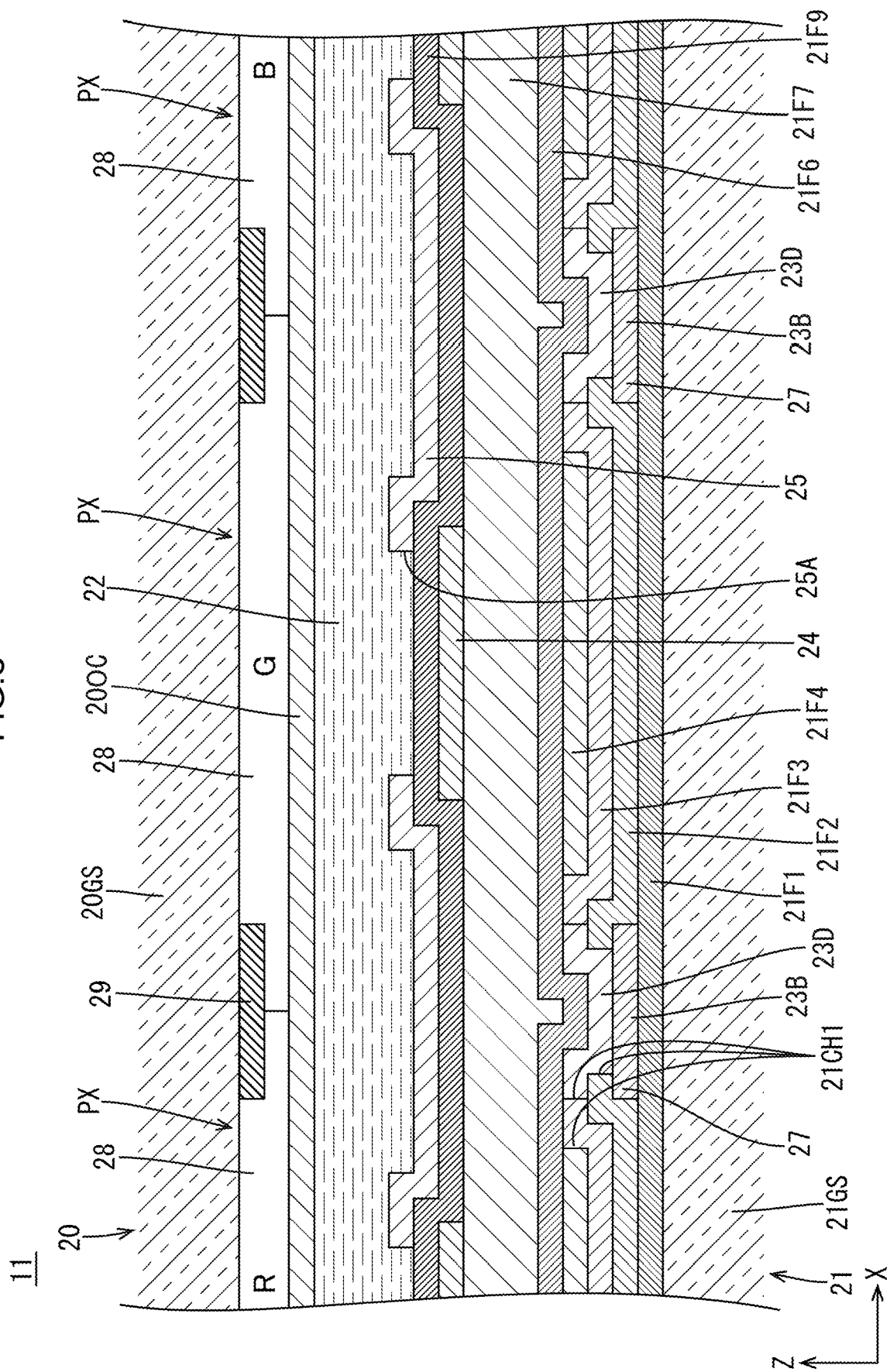
FIG. 6 is a cross-sectional view of the liquid crystal panel taken along line A-A in FIG. 4.

FIG. 6 is a cross-sectional view of a middle section of the pixel PX included in the liquid crystal panel 11 (a cross-sectional view taken along line A-A in FIG. 4). As illustrated in FIG. 6, the liquid crystal panel 11 includes a pair of substrates 20 and 21 and a liquid crystal layer 22 (a medium layer) between the substrates 20 and 21. The liquid crystal layer 22 includes liquid crystal molecules that are substances having optical characteristics that change according to application of an electric field. Color filters 28 that exhibit three different colors of blue (B), green (G), and red (R) are disposed in the display area AA on the inner surface side of the opposed substrate 20. The color filters 28 that exhibit different colors are arranged along the gate lines 26 (in the X-axis direction). The color filters 28 that exhibit different colors extend along the source lines 27 (substantially the Y-axis direction). Namely, the color filters 28 that exhibit different colors are arranged in a stripe as a whole. The color filters 28 are arranged to overlap the pixel electrodes 24 on the array substrate 21, respectively, in a plan view. The color filters 28 that exhibit different colors are arranged such that boundaries therebetween (a color boundary) overlap the source lines 27. In the liquid crystal panel 11, the R, the G, and the B color filters 28 that are arranged along the X-axis direction and three pixel electrodes 24 opposed to the respective color filters 28 compose three colors of pixels PX. In the liquid crystal panel 11, the R, the G, and the B pixels PX that are adjacent to one another in the X-axis direction form display pixels configured to perform color display in predefined tones. An interval of the pixels PX in the Y-axis direction is about three times as an interval of the pixels PX in the X-axis direction.

The liquid crystal panel 11 according to this embodiment is used for the head-mounted display 10HMD and has a quite high definition. As illustrated in FIG. 6, the interval between the pixels PX in the X-axis direction is about 10.95 μm. The width of the gate lines 26 and the source lines 27 is about from 1.5 μm to 2.5 μm. The opposed substrate 20 includes black matrix sections 29 that define each of the color filters 28 that exhibit different colors. The black matrix sections 29 extend substantially straight along the Y-axis direction and are arranged at intervals to sandwich the color filters 28 in the X-axis direction. The black matrix sections 29 overlap the source lines 27 of the array substrate 21, respectively. The black matrix sections 29 and the source lines 27 prevent colors from mixing that may be caused between the pixels PX exhibiting different colors. An overcoat film 20OC is included in an upper layer than the color filters 28 (closer to the liquid crystal layer 22) and disposed in a solid pattern over a substantially entire area of the opposed substrate 20 for planarization. The opposed substrate 20 includes spacers 20SP (refer to thick two-dotted chain lines in FIG. 4) at specified positions where the gate lines 26 and the source lines 27 intersect. The spacers 20SP project from the opposed substrate 20 toward the array substrate 21 through the liquid crystal layer 22 and are in contact with the inner surface of the array substrate 21. The spacers 20SP maintain the distance between the substrates 20, 21. The spacer 20SP extends in an area with respect to the X-axis direction so as to extend from one pixel PX to another pixel PX and overlaps two contact portions 24B (two third contact holes 21CH3). Alignment films for orienting the liquid crystal molecules included in the liquid crystal layer 22 are formed on innermost surfaces of the substrates 20, 21 that are in contact with the liquid crystal layer 22.

Next, a common electrode 25 will be described with reference to FIGS. 5 and 6. As illustrated in FIG. 6, a common electrode 25 is disposed to overlap all the pixel electrodes 24 in the display area AA on an inner surface side of the array substrate 21. The common electrode 25 is included in an upper layer than the pixel electrodes 24. The common electrode 25 spreads over substantially an entire area of the display area AA in a solid state. As illustrated in FIGS. 5 and 6, the common electrode 25 includes openings 25A in portions overlapping the pixel electrodes 24, respectively. The openings 25A of the common electrode 25 are illustrated with two-dotted chain lines in FIG. 5. The plan-view shape of the openings 25A in the common electrode 25 is substantially similar to the plan-view shape of the pixel electrode bodies 24A. The plan-view size of the openings 25A in the common electrode 25 is slightly smaller than the plan-view size of the pixel electrode bodies 24A. The openings 25A are formed in the common electrode 25 such that edges of the openings 25A overlap the pixel electrode bodies 24A. The common electrode 25 is supplied with common potential signals (reference potential signals) of a common potential (a reference potential). When a potential difference occurs between the pixel electrode 24 and the common electrode 25 that overlap each other as the pixel electrode 24 is charged, a fringe electric field (an oblique electric field) is created between an opening edge of the opening 25A in the common electrode 25 and the pixel electrode 24. The fringe electric field includes a component parallel to the plate surface of the array substrate 21 and a component normal to the plate surface of the array substrate 21. With the fringe electric field, orientations of the liquid crystal molecules included in the liquid crystal layer 22 can be controlled. Namely, the liquid crystal panel 11 according to this embodiment operates in fringe field switching (FFS) mode.

Figure 10:
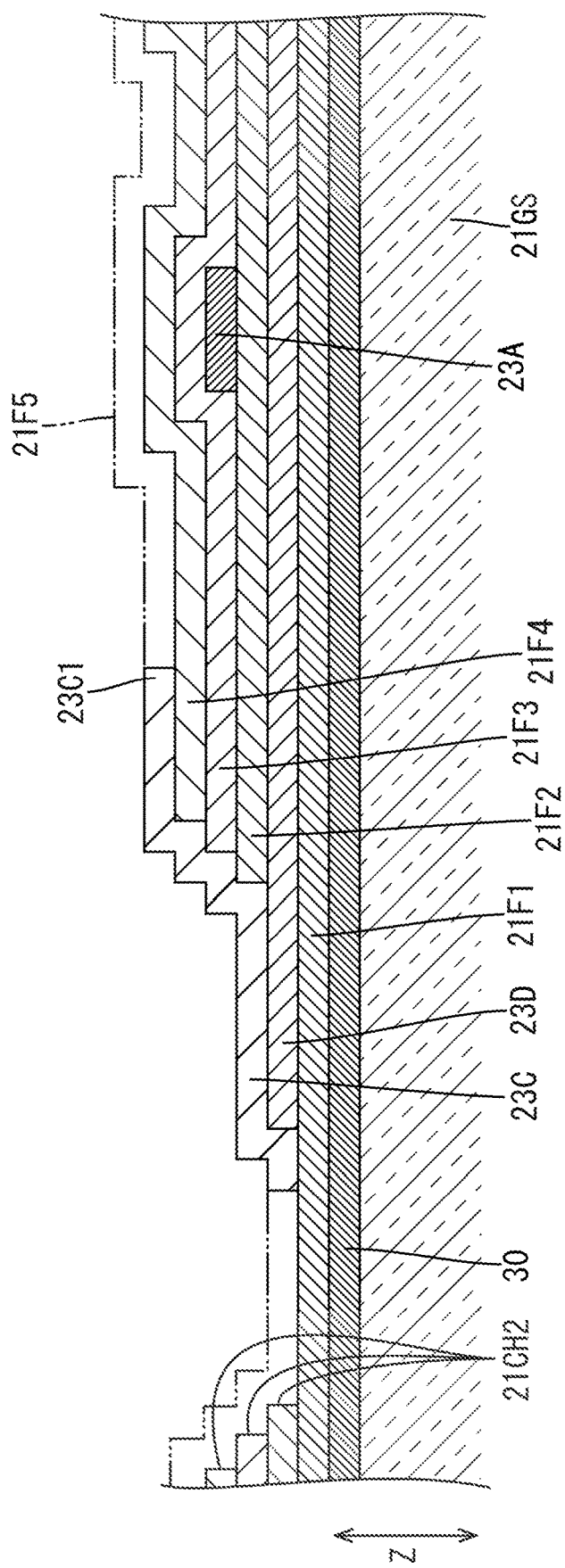
FIG. 10 is a cross-sectional view taken along the same line as that in FIG. 9 and illustrating the third metal film being subjected to patterning after a seventh step of the method of producing the array substrate.
Figure 11:
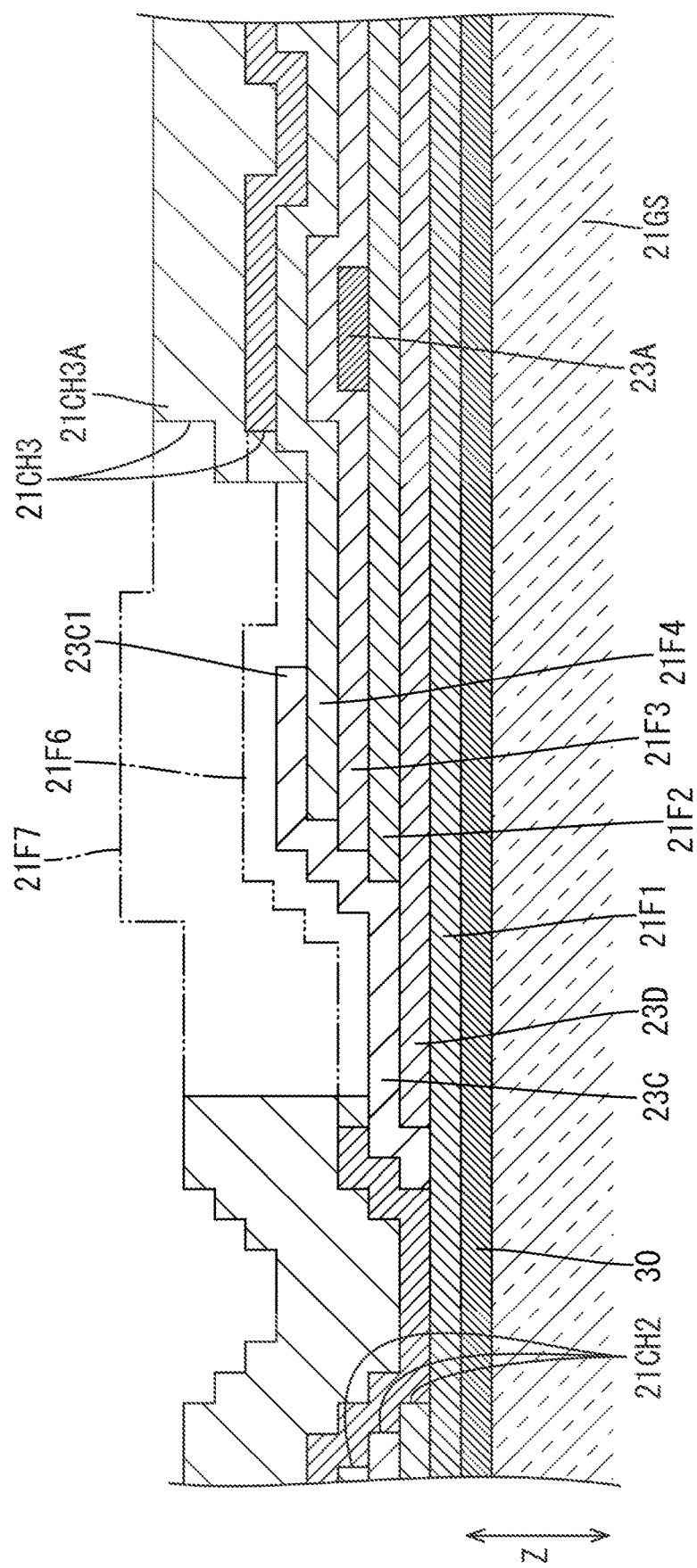
FIG. 11 is a cross-sectional view taken along the same line as that in FIG. 9 and illustrating the third interlayer insulation film and the first planarization film being subjected to patterning after an eighth step of the method of producing the array substrate.
Figure 12:
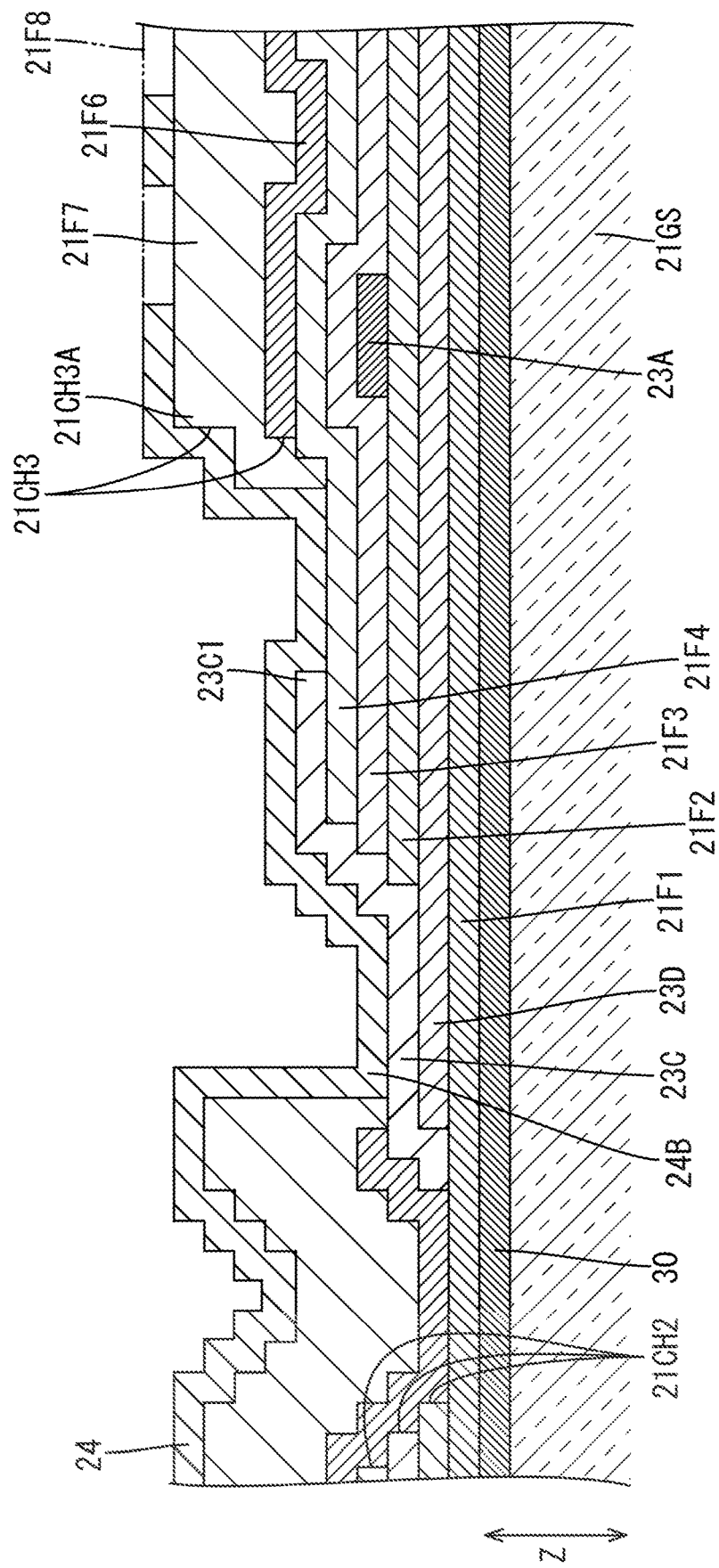
FIG. 12 is a cross-sectional view taken along the same line as that in FIG. 9 and illustrating the first transparent electrode film being subjected to patterning after a ninth step of the method of producing the array substrate.
Figure 13:
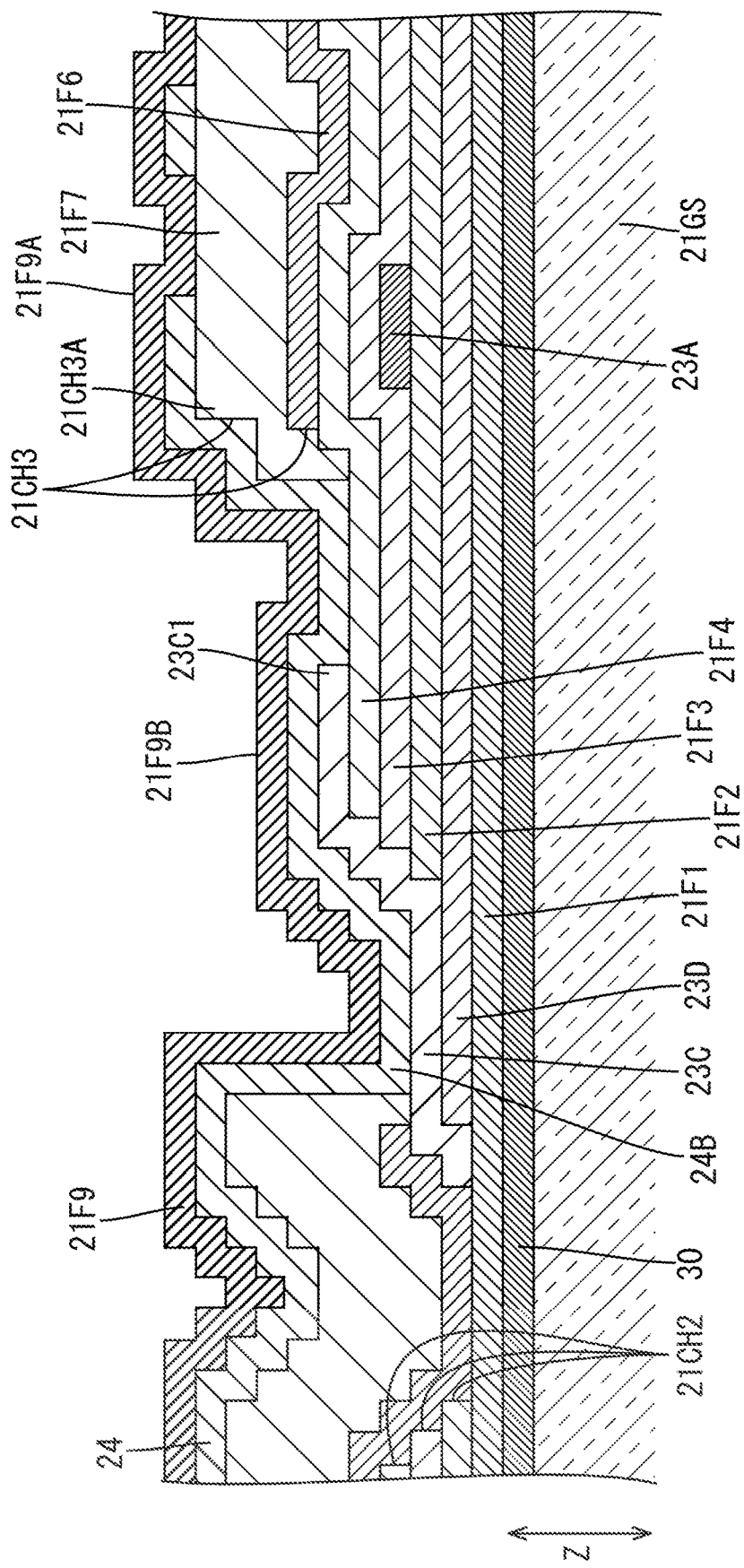
FIG. 13 is a cross-sectional view taken along the same line as that in FIG. 9 and illustrating the fourth interlayer insulation film being subjected to patterning after a tenth step of the method of producing the array substrate.
Figure 14:
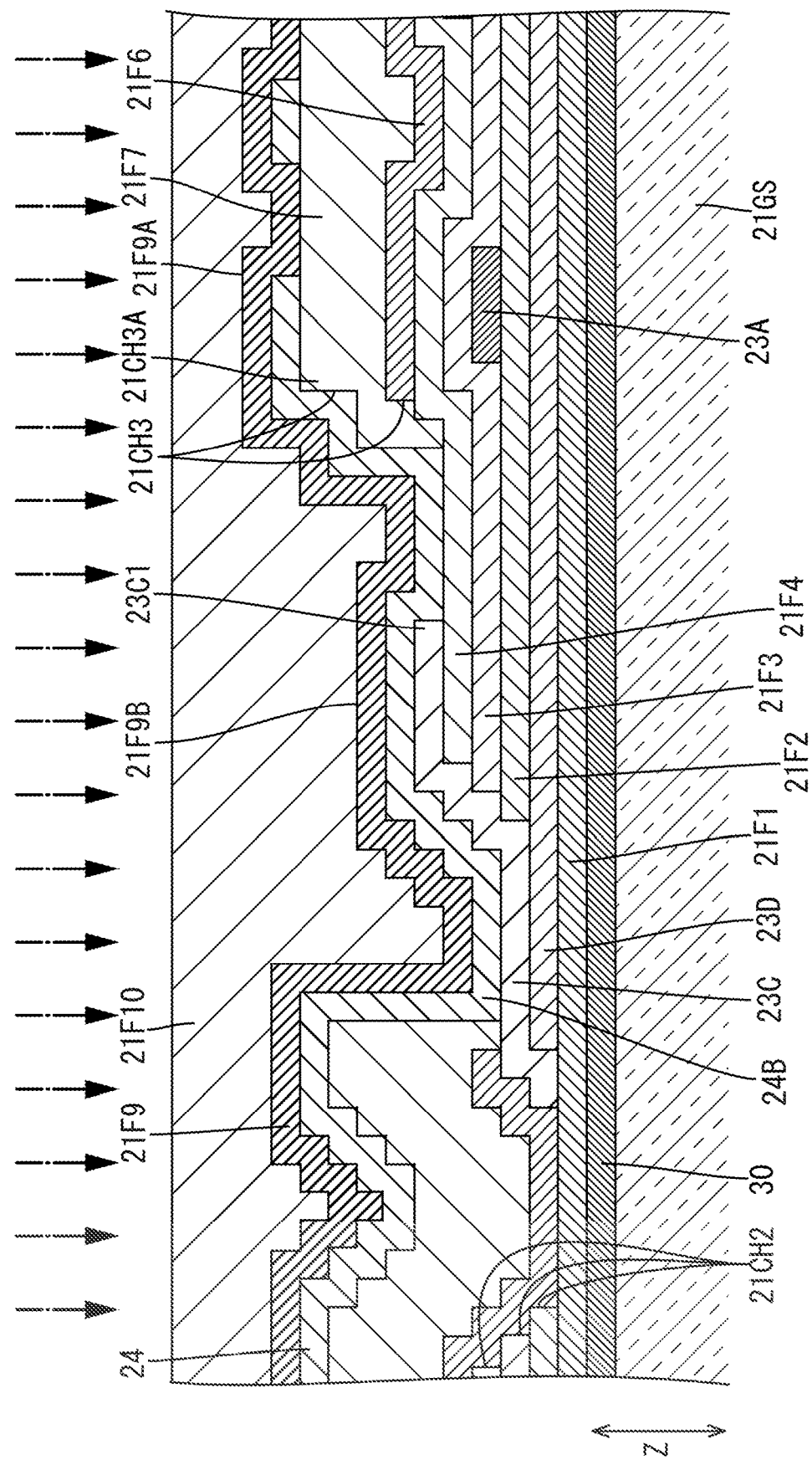
FIG. 14 is a cross-sectional view taken along the same line as that in FIG. 9 and illustrating the second planarization film that is subjected to exposure with an entire surface after an eleventh step of the method of producing the array substrate.
Figure 16:
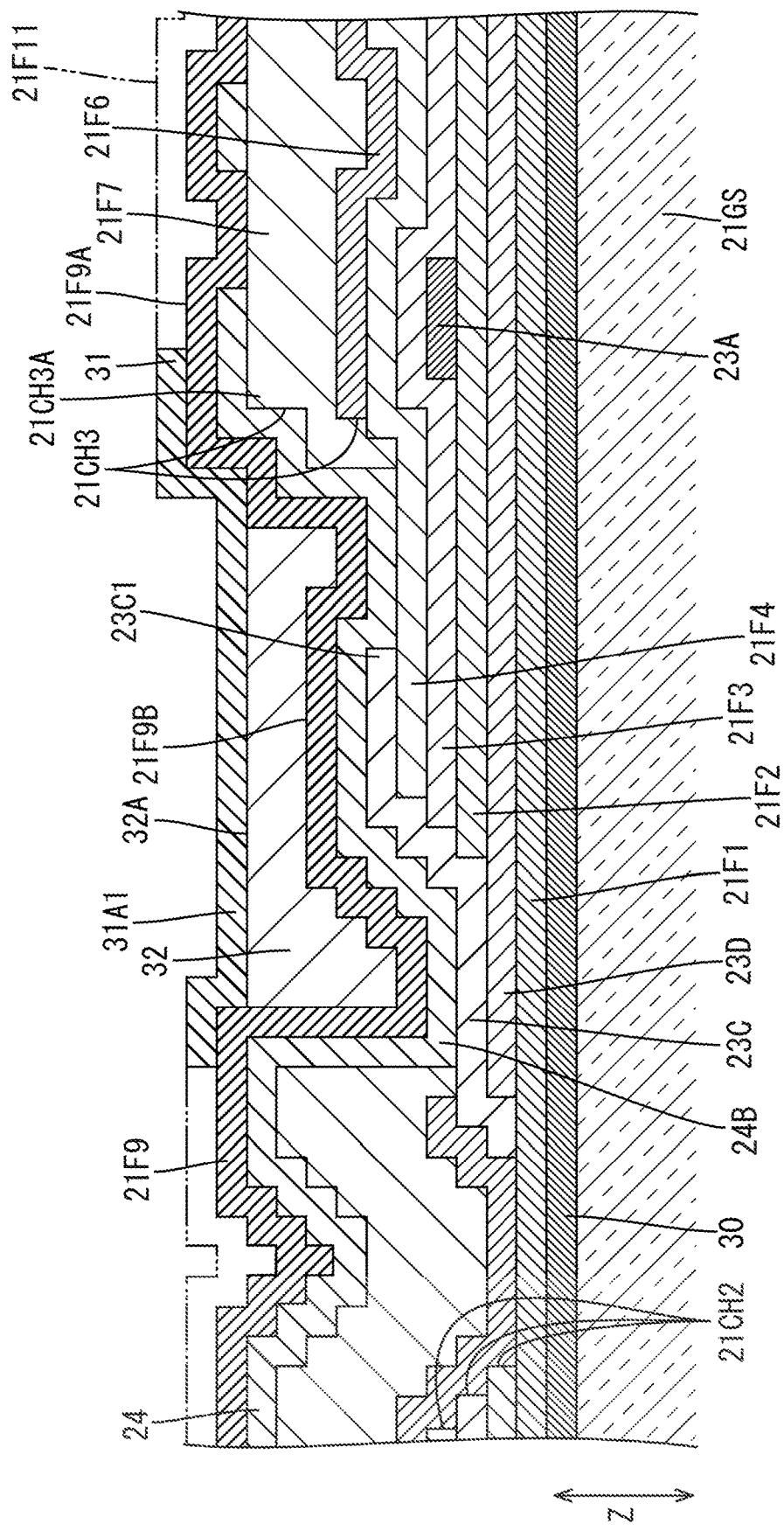
FIG. 16 is a cross-sectional view taken along the same line as that in FIG. 9 and illustrating the fourth metal film that is subjected to patterning after a twelfth step of the method of producing the array substrate.
Figure 17:
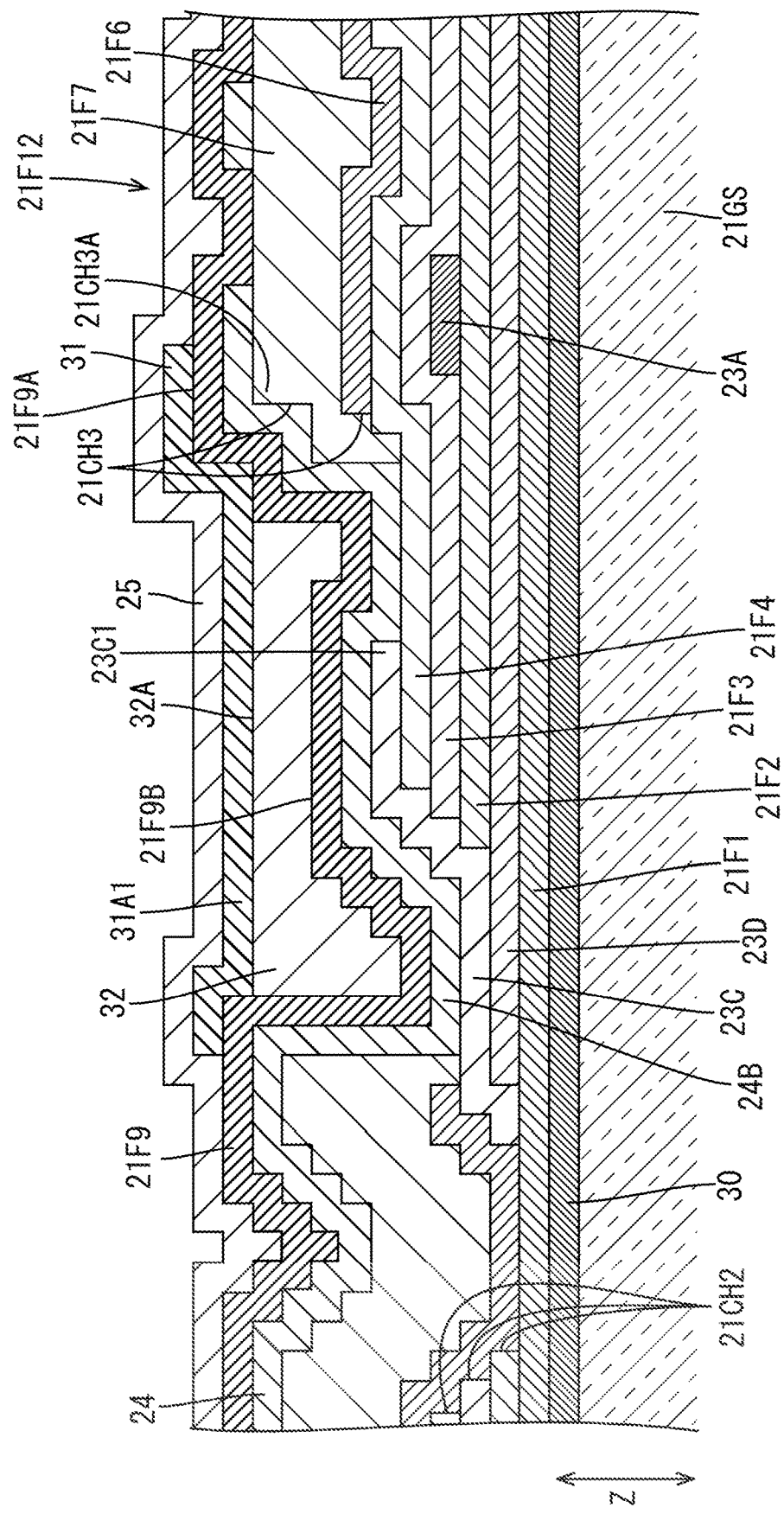
FIG. 17 is a cross-sectional view taken along the same line as that in FIG. 9 and illustrating the second transparent electrode film that is subjected to patterning after a thirteenth step of the method of producing the array substrate.

Various films disposed in layers on the glass substrate 21GS of the array substrate 21 will be described in detail with reference to FIGS. 10 to 17. FIGS. 10 to 17 are cross-sectional views each of which illustrates a portion of the array substrate 21 adjacent to the drain electrode 23C while the array substrate 21 being produced. As illustrated in FIGS. 10 to 17, on the glass substrate 21GS of the array substrate 21, the following films are at least disposed in the following order from the lowest layer (the grass substrate GS): a first metal film (a first light blocking film), a basecoat film 21F1, a semiconductor film, a gate insulation film 21F2, a second metal film, a first interlayer insulation film 21F3, a second interlayer insulation film 21F4, a third metal film 21F5 (a first conductive film), a third interlayer insulation film 21F6 (a first insulation film), a first planarization film 21F7 (a first insulation film), a first transparent electrode film 21F8 (a second conductive film), a fourth interlayer insulation film 21F9 (a second insulation film), a second planarization film 21F10 (a third insulation film), a fourth metal film 21F11 (a third conductive film, a second light blocking film), a second transparent electrode film 21F12 (a fourth conductive film), and a bump film (a fourth insulation film, a third planarization film). In addition to the above films, an alignment film is disposed on the glass substrate 21GS of the array substrate 21. The third metal film 21F5 is illustrated in FIG. 10, the third interlayer insulation film 21F6 and the first planarization film 21F7 are illustrated in FIG. 11, the first transparent electrode film 21F8 is illustrated in FIG. 12, the fourth interlayer insulation film 21F9 is illustrated in FIG. 13, the second planarization film 21F10 is illustrated in FIG. 14, the fourth metal film 21F11 is illustrated in FIG. 16, and the second transparent electrode film 21F12 is illustrated in FIG. 17 with two-dotted lines.

Each of the first metal film, the second metal film, the third metal film 21F5, and the fourth metal film 21F11 is a single-layer film made of one kind of metal, a multilayer film made of different kinds of metals, or alloy, and has electrically conductive properties and light blocking properties. Each of the basecoat film 21F1, the gate insulation film 21F2, the first interlayer insulation film 21F3, the second interlayer insulation film 21F4, the third interlayer insulation film 21F6, and the fourth interlayer insulation film 21F9 is made of inorganic material (inorganic resin material) such as silicon oxide ($SiO_2$) layer and silicon nitride ($SiN_x$). The first interlayer insulation film 21F3 and the second interlayer insulation film 21F4 are made of different materials. The first interlayer insulation film 21F3 is made of $SiN_x$ and the second interlayer insulation film 21F4 is made of $SiO_2$, for example. The first planarization film 21F7, the second planarization film 21F10, and the bump film are made of organic material (organic resin material) such as acrylic resin (PMMA). The first planarization film 21F7, the second planarization film 21F10, and the bump film that are made of organic material normally have a film thickness greater than that of the basecoat film 21F1, the gate insulation film 21F2, the first interlayer insulation film 21F3, the second interlayer insulation film 21F4, the third interlayer insulation film 21F6, and the fourth interlayer insulation film 21F9 that are made of inorganic material. Among the first planarization film 21F7, the second planarization film 21F10, and the bump film, at least the second planarization film 21F10 is made of photosensitive material. In this embodiment, the photosensitive material used for the second planarization film 21F10 is a positive-type photosensitive material. The semiconductor film is a thin film of a CG silicon (continuous grain silicon) that is a kind of polycrystallized silicon (polycrystalline silicon). The CG silicon thin film is prepared by adding metal material to an amorphous silicon thin film and heating the amorphous silicon at a low temperature of 550° or lower for a short time. This provides continuity of the atomic arrangement at the silicon grain boundaries. The first transparent electrode film 21F8 and the second transparent electrode film 21F12 are made of transparent electrode material such as indium tin oxide (ITO) or indium zinc oxide (IZO).

Figure 7:
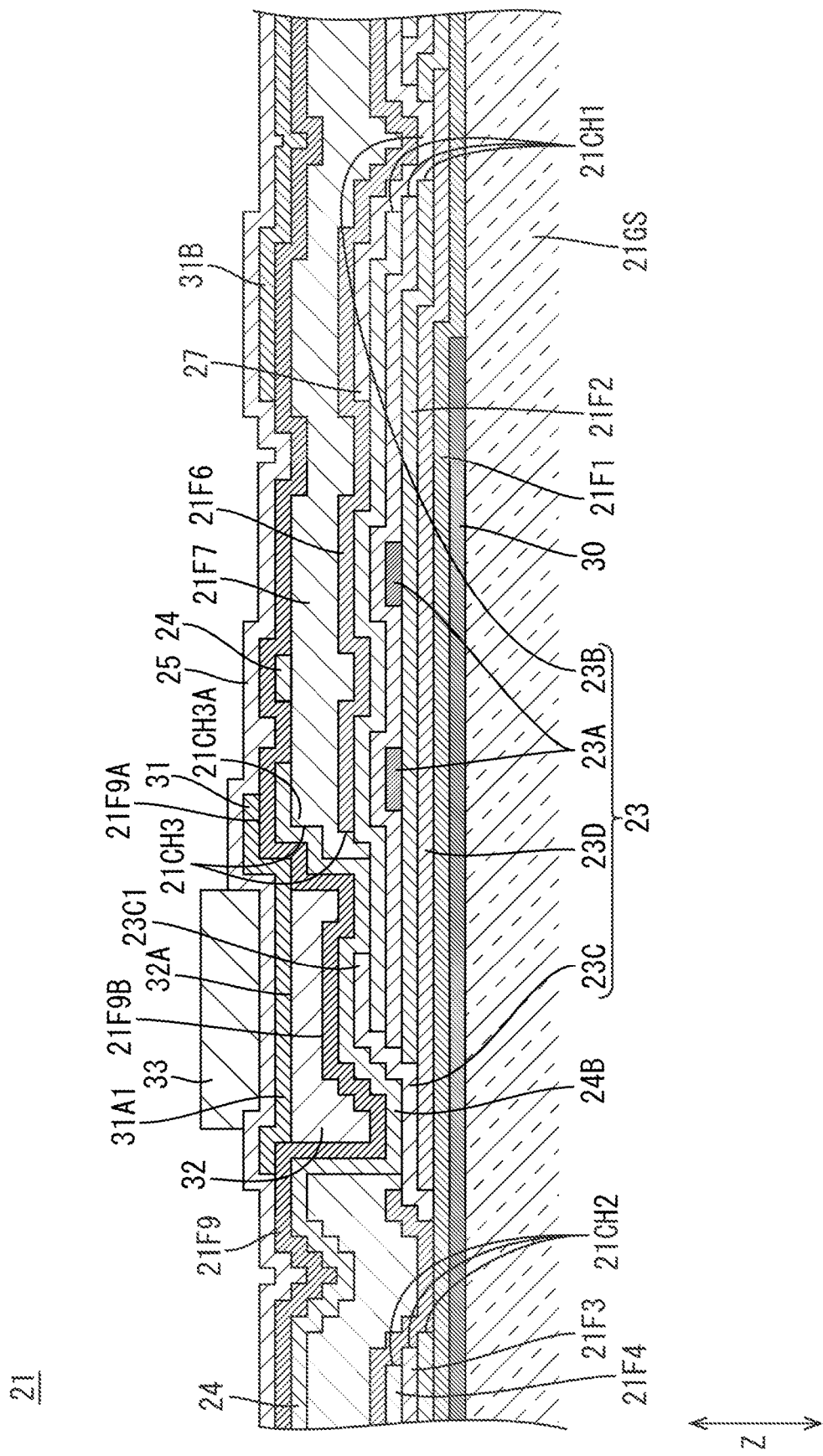
FIG. 7 is a cross-sectional view of the array substrate taken along line B-B in FIG. 4.
Figure 8:
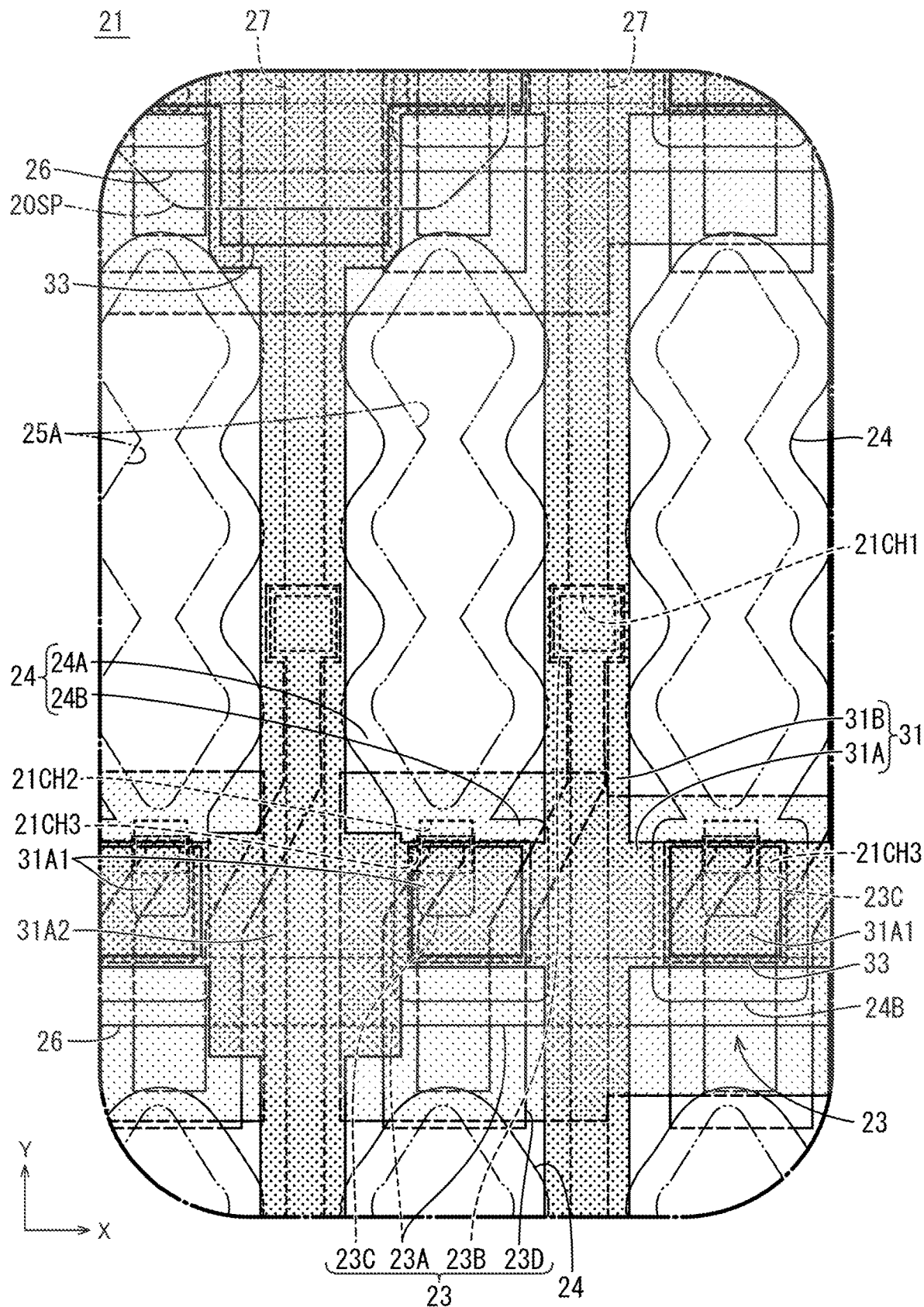
FIG. 8 is a plan view illustrating a pixel arrangement in the display area of the array substrate and illustrating configurations of a first metal film and a fourth metal film with shading.

Next, a cross-sectional configuration of each TFT 23 and relations of the TFT 23 and the films of the array substrate 21 will be described with reference to FIGS. 7 and 8. FIG. 7 is a cross-sectional view of the array substrate 21 taken along the channel 23D (a cross-sectional view along B-B line in FIG. 4). FIG. 8 is a plan view illustrating the pixel arrangement of the display area AA of the array substrate 21 similar to FIGS. 4 and 5. The configurations of the first metal film and the fourth metal film 21F11 included in the array substrate 21 are illustrated with different types of shadings in FIG. 8. As illustrated in FIG. 7, the TFTs 23 are top-gate type TFTs and the gate electrodes 23A are disposed to overlap the channels 23D via the gate insulation film 21F2, respectively, and included in an upper layer than the channels 23D. As illustrated in FIGS. 7 and 8, the array substrate 21 includes the first light blocking portions 30 that are portions of the first metal film and overlap the channels 23D. Since the first light blocking portions 30 are included in a lower layer than the channels 23D, the first light blocking portion 30 blocks the light supplied from the backlight 12 to the channels 23D from the lower layer side. This can suppress variation in the characteristics of the TFTs 23 that may be caused when the light is supplied to the channels 23D. The first light blocking portions 30 have a laterally-long rectangular shape that extends along the X-axis direction. The first light blocking portion 30 has a length that straddles the pixels PX and overlaps the channels 23D of the TFTs 23. The first light blocking portion 30 has a width that changes along the X-axis direction and a smallest width of the first light blocking portion 30 is greater than the width of the gate lines 26. The first light blocking portion 30 overlaps most portions of the channels 23D except for portions of the bent sections. The first light blocking portion 30 overlaps the gate electrodes 23A and the drain electrodes 23C of the TFTs 23. The first light blocking portions 30 overlap the spacers 20SP of the opposed substrate 20.

As illustrated in FIG. 7, the basecoat film 21F1 is disposed between the first light blocking portion 30, which is a portion of the first metal film, and the channel 23D, which is a portion of the semiconductor film, with respect to the Z-axis direction to keep insulation between the basecoat film 21F1 and the channel 23D. With the basecoat film 21F1, impurities from the glass substrate 21GS are less likely to be dispersed within the semiconductor film. The gate insulation film 21F2 is disposed between the channels 23D, which are portions of the semiconductor film, and the gate electrodes 23A, which are portions of the second metal film, with respect to the Z-axis direction to keep insulation between the channels 23D and the gate electrodes 23A. The second interlayer insulation film 21F4 is disposed directly on the first interlayer insulation film 21F3. The first interlayer insulation film 21F3 and the second interlayer insulation film 21F4 are disposed between the gate lines 26, which are portions of the second metal film, and the source lines 27, which are portions of the third metal film 21F5, with respect to the Z-axis direction to keep insulation between the gate lines 26 and the source lines 27 (refer to FIG. 4). The gate insulation film 21F2, the first interlayer insulation film 21F3, and the second interlayer insulation film 21F4 include first contact holes 21CH1 in portions thereof overlapping the source electrodes 23B. The source electrodes 23B are connected to the channels 23D via the first contact holes 21CH1. The gate insulation film 21F2, the first interlayer insulation film 21F3, and the second interlayer insulation film 21F4 include second contact holes 21CH2 in portions thereof overlapping the drain electrodes 23C. The drain electrodes 23C are connected to the channels 23D via the second contact holes 21CH2. Left portions of the second contact holes 21CH2 in FIG. 7 (upper portions in FIG. 4) do not overlap the drain electrodes 23C.

As illustrated in FIG. 7, the first planarization film 21F7 is disposed directly on the third interlayer insulation film 21F6. The third interlayer insulation film 21F6 and the first planarization film 21F7 are disposed between the drain electrodes 23C, which are portions of the third metal film 21F5, and the pixel electrodes 24, which are portions of the first transparent electrode film 21F8, with respect to the Z-axis direction. The third interlayer insulation film 21F6 and the first planarization film 21F7 include third contact holes 21CH3 (contact holes) in portions thereof overlapping the drain electrodes 23C. The drain electrodes 23C are connected to the contact portions 24B of the pixel electrodes 24, respectively, via the third contact holes 21CH3. As illustrated in FIG. 5, the third contact holes 21CH3 have a rectangular plan-view shape that is slightly smaller than that of the contact portions 24B. The third contact holes 21CH3 overlap the contact portions 24B in almost entire portions except for the outer peripheral edge portions. As illustrated in FIG. 4, the third contact holes 21CH3 overlap almost entire portions of the drain electrodes 23C. The drain electrodes 23C have a rectangular shape having four edges. Three edges 23C1 except for one edge (an upper edge in FIG. 4) are disposed within the third contact hole 21CH3. The third contact holes 21CH3 overlap sections of the second contact holes 21CH2 overlapping the drain electrodes 23C but do not overlap sections of the second contact holes 21CH2 that do not overlap the drain electrodes 23C.

As illustrated in FIG. 7, the pixel electrodes 24 are portions of the first transparent electrode film 21F8. The common electrode 25 is a portion of the second transparent electrode film 21F12. The fourth interlayer insulation film 21F9 is disposed in a solid pattern in a substantially entire area of the plate surface of the array substrate 21. Namely, the fourth interlayer insulation film 21F9 is disposed inside and outside the third contact holes 21CH3. The portions of the fourth interlayer insulation film 21F9 that are disposed outside the third contact holes 21CH3 are disposed between the pixel electrodes 24, which are portions of the first transparent electrode film 21F8, and the common electrode 25, which is a portion of the second transparent electrode film 21F12, with respect to the Z-axis direction. This keeps insulation between the pixel electrodes 24 and the common electrode 25. The thickness and the relative permittivity of the fourth interlayer insulation film 21F9 influence the magnitude of electric field created between the pixel electrodes 24 and the common electrode 25. Therefore, appropriate values need to be set for the thickness and the relative permittivity of the fourth interlayer insulation film 21F9. To set an appropriate thickness and appropriate relative permittivity, inorganic material is preferably used for the material of the fourth interlayer insulation film 21F9; however, the fourth interlayer insulation film 21F9 may not necessarily be made of inorganic material. The portions of the fourth interlayer insulation film 21F9 that are disposed inside the third contact holes 21CH3 are disposed between the pixel electrodes 24, which are portions of the first transparent electrode film 21F8, and a second light blocking portion 31 (conductive portions), which is a portion of the fourth metal film 21F11, with respect to the Z-axis direction. This keeps insulation between the pixel electrodes 24 and the second light blocking portion 31. The fourth interlayer insulation film 21F9 is disposed on and included in an upper layer than the three edges 23C1 of the drain electrode 23C that are disposed inside the third contact hole 21CH3 (refer to FIG. 4). Therefore, level difference (a step) is created due to the three edges 23C1 of the drain electrode 23C disposed on the portion of the fourth interlayer insulation film 21F9 inside the third contact hole 21CH3. The second light blocking portion 31 will be described in detail in the following sections. Portions of the second planarization film 21F10 are configured as insulation portions 32.

As illustrated in FIG. 8, the array substrate 21 includes the second light blocking portion 31 that is a portion of the fourth metal film 21F11. The second light blocking portion 31 has a plan-view matrix shape and overlaps the gate lines 26 and the source lines 27. The second light blocking portion 31 includes first extending portions 31A that extend along the X-axis direction and second extending portions 31B that extend along the Y-axis direction. The first extending portions 31A overlap the gate lines 26. The first extending portion 31A blocks the light from travelling between the two pixels PX (the pixel electrodes 24) that are adjacent to each other in the Y-axis direction. The second extending portions 31B overlap the source lines 27. The second extending portion 31B and the black matrix sections 29 of the opposed substrate 20 block the light from travelling between the two pixels PX that are adjacent to each other in the X-axis direction. The liquid crystal panel 11 according to this embodiment is particularly used for the head-mounted display 10HMD and has quite high definition. Therefore, with less light traveling between the adjacent pixels PX, high display quality can be obtained. The first extending portions 31A and the second extending portions 31B cross each other and are continuous to each other at the crossing sections. An entire area of the second light blocking portion 31 is contacted with and electrically connected to the common electrode 25, which is a portion of the second transparent electrode film 21F12. The second transparent electrode film 21F12 is included in an upper layer than the second light blocking portion 31. Thus, the second light blocking portion 31 having a matrix shape has electrically conductive properties and is electrically connected to the common electrode 25. With such a configuration, a resistance distribution that may be created in the common electrode 25 can be reduced. Furthermore, with the second light blocking portion 31 being covered with the common electrode 25 that is included in an upper layer than the second light blocking portion 31, the second light blocking portion 31 is less likely to be exposed to the external front side. Accordingly, the second light blocking portion 31 is less likely to be corroded due to electro corrosion.

As illustrated in FIG. 8, the first extending portions 31A overlap the first light blocking portion 30. The first extending portions 31A have a width that is smaller than the width of the first light blocking portion 30. The first extending portions 31A include first conductive sections 31A1 and second conductive sections 31A2. The first conductive sections 31A1 overlap the contact portions 24B of the pixel electrodes 24, respectively, inside the third contact holes 21CH3. Flatness of the alignment film may be deteriorated near the third contact holes 21CH3 due to the third contact holes 21CH3. If the flatness of the alignment film is deteriorated, orientation errors may be caused in the liquid crystal molecules. If the orientation errors are caused in the liquid crystal molecules, light may always pass through the portions adjacent to the third contact holes 21CH3. In this respect, with the first conductive sections 31A1, the light that is to leak through the portions adjacent to the third contact holes 21CH3 can be blocked by the first conductive sections 31A1 and the leaking of light can be suppressed. The first conductive sections 31A1 are disposed at intervals with respect to the X-axis direction and the Y-axis direction. The first conductive sections 31A1 are disposed to overlap at least the edges 21CH3A of the third contact holes 21CH3, which are formed in the first planarization film 21F7. Thus, the whole third contact hole 21Ch3 is covered with the first conductive section 31A1 and this increases reliability of suppressing leaking of light through the third contact hole 21CH3. With at least the fourth interlayer insulation film 21F9 being disposed between the first conductive sections 31A1 and the contact portions 24B overlapping each other, insulation between the first conductive sections 31A1 and the contact portions 24B is maintained. The second conductive sections 31A2 extend in the X-axis direction to extend between the third contact holes 21CH3 and are continuous to the first conductive sections 31A1 that are disposed at intervals in the X-axis direction. The second conductive section 31A2 is disposed to cross the source line 27 that is disposed in a middle between the two first conductive sections 31A1 that are adjacent to each other at an interval in the X-axis direction. Thus, since the second conductive section 31A2 is continuous to the multiple first conductive sections 31A1, the resistance distribution that may be created in the common electrode 25 can be reduced.

Figure 9:
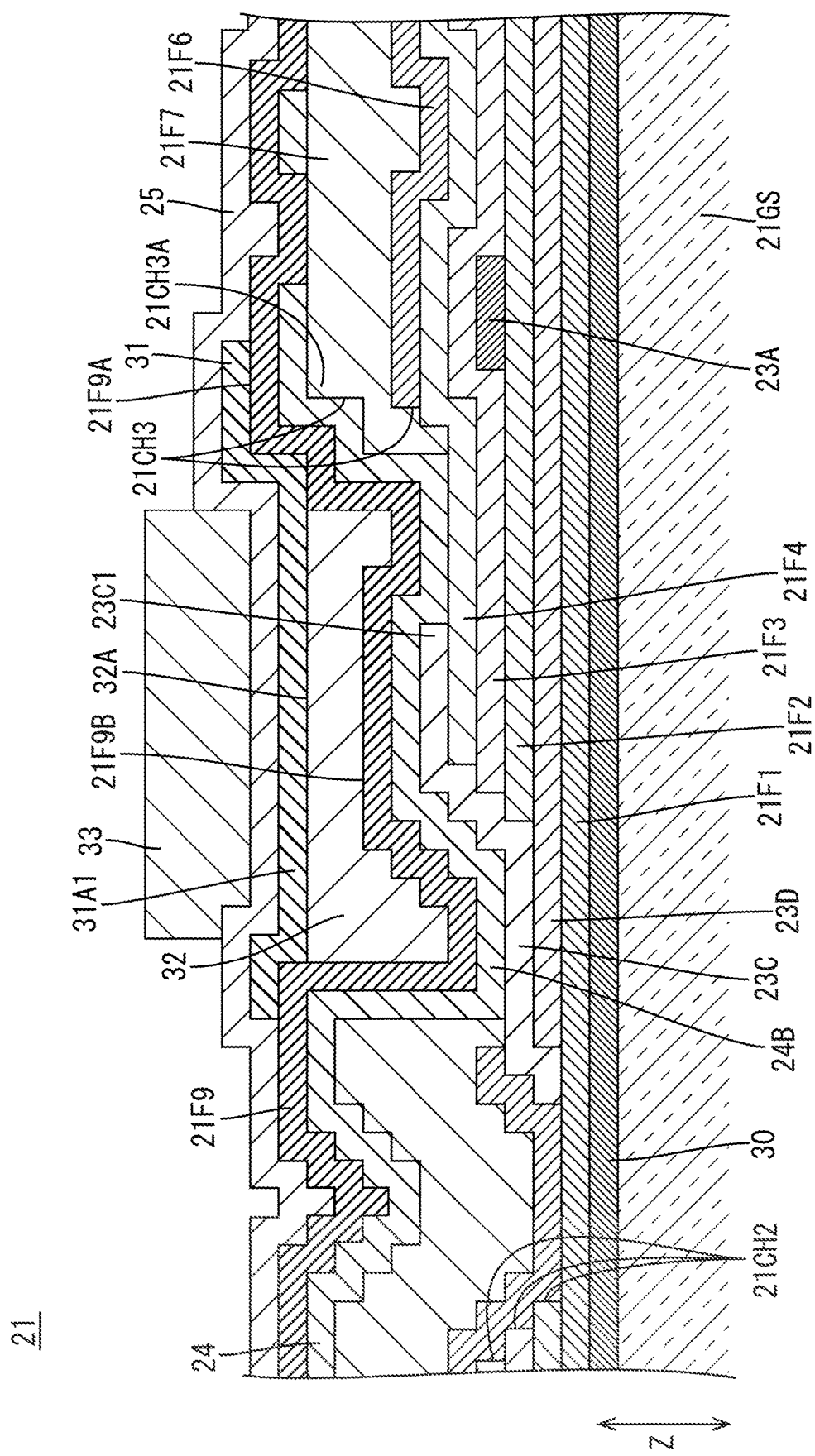
FIG. 9 is a magnified cross-sectional view of the cross-sectional view taken along line B-B in FIG. 4 and illustrating a portion of the array substrate adjacent to an insulation portion.

As illustrated in FIG. 9, the array substrate 21 includes the insulation portions 32 that are portions of the second planarization film 21F10. The insulation portions 32 are included in an upper layer than the pixel electrodes 24, which are portions of the third metal film 21F5, and included in a lower layer than the second light blocking portion 31, which is a portion of the fourth metal film 21F11. FIG. 9 is an enlarged cross-sectional view illustrating a portion of FIG. 7 and the portion adjacent to the insulation portion 32. The insulation portion 32 overlaps the pixel electrode 24 inside the third contact hole 21CH3. The insulation portion 32 is disposed inside the third contact hole 21CH3 and between the fourth interlayer insulation film 21F9 and the first conductive section 31A1 of the second light blocking portion 31 with respect to the Z-axis direction. Namely, in addition to the fourth interlayer insulation film 21F9, the insulation portion 32 is disposed between the contact portion 24B of the pixel electrode 24 and the first conductive section 31A1 of the second light blocking portion 31. As described before, the level differences (the steps) are created on the portion of the fourth interlayer insulation film 21F9 inside the third contact hole 21CH3 due to the three edges 23C1 of the drain electrode 23C. At the steps of the fourth interlayer insulation film 21F9, coverage of the fourth interlayer insulation film 21F9 with respect to the contact portion 24B of the pixel electrode 24, which is included in a lower layer than the fourth interlayer insulation film 21F9, is deteriorated and the film may be broken. In this respect, the insulation portion 32, which is a portion of the second planarization film 21F10, is disposed between the contact portion 24B of the pixel electrode 24 and the first conductive section 31A1 of the second light blocking portion 31 with respect to the Z-axis direction. Therefore, with the insulation portion 32, even if a hole is created in the fourth interlayer insulation film 21F9 due to the breaking of the fourth interlayer insulation film 21F9, the contact portion 24B and the first conductive section 31A1 are less likely to be short-circuited via the hole. Particularly, in this embodiment, the common electrode 25 is disposed on and included in an upper layer than the second light blocking portion 31, and the common electrode 25 and the second light blocking portion 31 are electrically connected to each other. The insulation portion 32 suppresses short-circuits that may occur between the common electrode 25 and the pixel electrode 24 via the second light blocking portion 31. Accordingly, display errors that may be caused when the potential of the pixel electrode 24 becomes equal to the potential of the common electrode 25 are less likely to be caused.

As illustrated in FIG. 9, an upper surface 32A of the insulation portion 32 is at a lower level than an upper surface 21F9A of the portion of the fourth interlayer insulation film 21F9 around the third contact hole 21CH3. Namely, the insulation portion 32 does not project upward than the upper surface 21F9A of the portion of the fourth interlayer insulation film 21F9 around the third contact hole 21CH3. With such a configuration, the insulation portion 32 is less likely to be contacted with other components. In such a configuration, a gap is created between the upper surface 21F9A of the portion of the fourth interlayer insulation film 21F9 around the third contact hole 21CH3 and an upper surface 21F9B of a portion of the fourth interlayer insulation film 21F9 inside the third contact hole 21CH3. The insulation portion 32, which is a portion of the second planarization film 21F10, is thicker than the fourth interlayer insulation film 21F9, which is made of inorganic material. Since the insulation portion 32, which is a portion of the second planarization film 21F10 and thicker than the fourth interlayer insulation film 21F9, is disposed inside the third contact hole 21CH3, the gap between the upper surface 21F9A and the upper surface 21F9B is compensated.

As illustrated in FIG. 9, the array substrate 21 includes bump portions 33 (a second insulation portion) which is portions of the bump film. The bump portions 33 are disposed to overlap at least the first conductive sections 31A1 of the second light blocking portion 31 inside the third contact holes 21CH3. With such a configuration, the gap between the upper surface 32A of the insulation portion 32 and the upper surface 21F9A of the portions of the fourth interlayer insulation film 21F9 around the third contact holes 21CH3 can be compensated by the bump portions 33. As illustrated in FIGS. 4, the bump portions 33 are arranged at intervals with respect to the X-axis direction and the Y-axis direction corresponding to the arrangement of the first conductive sections 31A1 and the third contact holes 21CH3. Some of the bump portions 33 overlap the spacers 20SP of the opposed substrate 20, respectively. Similar to the spacers 20SP, the bump portion 33 overlapping the spacer 20SP extends one pixel PX to another pixel PX and overlaps two third contact holes 21CH3. The bump portions 33 overlapping the spacers 20SP receive the spacers 20SP, respectively. Namely, the bump portions 33 and the spacers 20SP keep the distance between the substrates 20, 21. The bump portions 33 that do not overlap the spacers 20SP can receive an inner surface of the opposed substrate 20 and suppress further warping if any one of the substrates 20, 21 receives external force and is warped.

Next, a method of producing the array substrate 21 of the liquid crystal panel 11 will be described. The method of producing the array substrate 21 according to this embodiment at least includes a first step of disposing the first metal with patterning, a second step of disposing the basecoat film 21F1, a third step of disposing the semiconductor film with patterning, a fourth step of disposing the gate insulation film 21F2 with patterning, a fifth step of disposing the second metal film with patterning, a sixth step of disposing the first interlayer insulation film 21F3 and the second interlayer insulation film 21F4 sequentially, a seventh step of disposing the third metal film 21F5, an eighth step of disposing the third interlayer insulation film 21F6 and the first planarization film 21F7 sequentially with patterning, a ninth step of disposing the first transparent electrode film 21F8 with patterning, a tenth step of disposing the fourth interlayer insulation film 21F19 with patterning, an eleventh step of disposing the second planarization film 21F10 with patterning, a twelfth step of disposing the fourth metal film 21F11 with patterning, a thirteenth step of disposing the second transparent electrode film 21F12 with patterning, and a fourteenth step of disposing the bump film with patterning. In the following, steps of the seventh step to the thirteenth step will be described with reference to FIGS. 10 to 17.

The seventh step will be described. In the seventh step, the third metal film 21F5 and a resist film are subsequently disposed in a solid pattern on the second interlayer insulation film 21F4 and included in an upper layer than the second interlayer insulation film 21F4. Then, the resist film is subjected to exposure through a photomask with an exposure device and the exposed resist film is developed. With the third metal film 21F5 being subjected to etching with the developed resist film, the third metal film 21F5 is subjected to patterning as illustrated in FIG. 10. As a result, the drain electrodes 23C, which are portions of the third metal film 21F5, are formed. The source lines 27 and the source electrodes 23B, which are portions of the third metal film 21F5 different from the portions of the third metal film 21F5 configured as the drain electrodes 23C, are formed.

The eighth step will be described. In the eighth step, the third interlayer insulating film 21F6, the first planarization film 21F7, and a resist film are subsequently disposed in a solid pattern on the third metal film 21F5 and included in an upper layer than the third metal film 21F5. Then, the resist film is subjected to exposure through a photomask with an exposure device and the exposed resist film is developed. With the third interlayer insulation film 21F6 and the first planarization film 21F7 being subjected to etching with the developed resist film, the third interlayer insulation film 21F6 and the first planarization film 21F7 are subjected to patterning as illustrated in FIG. 11. As a result, the third contact holes 21CH3 are formed in portions of the third interlayer insulation film 21F6 and the first planarization film 21F7 overlapping the drain electrodes 23C, respectively.

The ninth step will be described. In the ninth step, the first transparent electrode film 21F8 and a resist film are subsequently disposed in a solid pattern on the first planarization film 21F7 and included in an upper layer than the first planarization film 21F7. Then, the resist film is subjected to exposure through a photomask with an exposure device and the exposed resist film is developed. With the first transparent electrode film 21F8 being subjected to etching with the developed resist film, the first transparent electrode film 21F8 is subjected to patterning as illustrated in FIG. 12. As a result, the pixel electrodes 24, which are portions of the first transparent electrode film 21F8, are formed. The contact portions 24B of the pixel electrodes 24 are connected to the drain electrodes 23C, respectively, via the third contact holes 21CH3.

The tenth step will be described. In the tenth step, the fourth interlayer insulation film 21F9 and a resist film are subsequently disposed in a solid pattern on the first transparent electrode film 21F8 and included in an upper layer than the first transparent electrode film 21F8. Then, the resist film is subjected to exposure through a photomask with an exposure device and the exposed resist film is developed. With the fourth interlayer insulation film 21F9 being subjected to etching with the developed resist film, the fourth interlayer insulation film 21F9 is subjected to patterning as illustrated in FIG. 13. The portions of the fourth interlayer insulation film 21F9 that are disposed inside the third contact holes 21CH3 are lower than the portions of the fourth interlayer insulation film 21F9 that are disposed outside the third contact holes 21CH3. Stepped portions may be created on the fourth interlayer insulation film 21F9 according to the recesses and protrusions of the lower layers. Particularly, stepped portions are created on the portion of the fourth interlayer insulation film 21F9 that is inside the third contact hole 21CH3 due to the three edges 23C1 of the drain electrode 23C. At the stepped portions of the fourth interlayer insulation film 21F9, coverage of the fourth interlayer insulation film 21F9 with respect to the contact portion 24B of the pixel electrode 24, which is included in a lower layer than the fourth interlayer insulation film 21F9, is deteriorated and the film may be broken.

The eleventh step will be described. In the eleventh step, as illustrated in FIG. 14, the second planarization film 21F10 is disposed in a solid pattern on the fourth interlayer insulation film 21F9 and included in an upper layer than the fourth interlayer insulation film 21F9. The portions of the second planarization film 21F10 inside the third contact holes 21CH3 are thicker than the portions of the second planarization film 21F10 outside the third contact holes 21CH3. Then, the second planarization film 21F10, which is made of positive-type photosensitive material, is subjected to exposure with an entire surface thereof without any resist film being disposed on the second planarization film 21F10. In FIG. 14, exposure light irradiated to the second planarization film 21F10 is illustrated with down arrows.

In the eleventh step, by controlling the light irradiation amount per unit time or the light exposure time, desired portions of the layers can be selectively exposed. For example, the second planarization film 21F10 can be subjected to exposure as follows. The portions of the second planarization film 21F10 outside the third contact holes 21CH3 are selectively subjected to exposure with a whole depth of the second planarization film 21F10. Upper sections (upper-layer side sections) of the portions of the second planarization film 21F10 inside the third contact holes 21CH3 are selectively subjected to exposure. Lower sections (lower-layer side sections) of the portions of the second planarization film 21F10 inside the third contact holes 21CH3 are not subjected to exposure. With the second planarization film 21F10 that is exposed as descried above being developed, the second planarization film 21F10 is subjected to patterning such that the non-exposed sections of the second planarization film 21F10 (the lower sections of the portions of the second planarization film 21F10 inside the third contact holes 21CH3) remain. Thus, as illustrated in FIG. 15, the insulation portions 32 are selectively disposed inside the third contact holes 21CH3.

Figure 15:
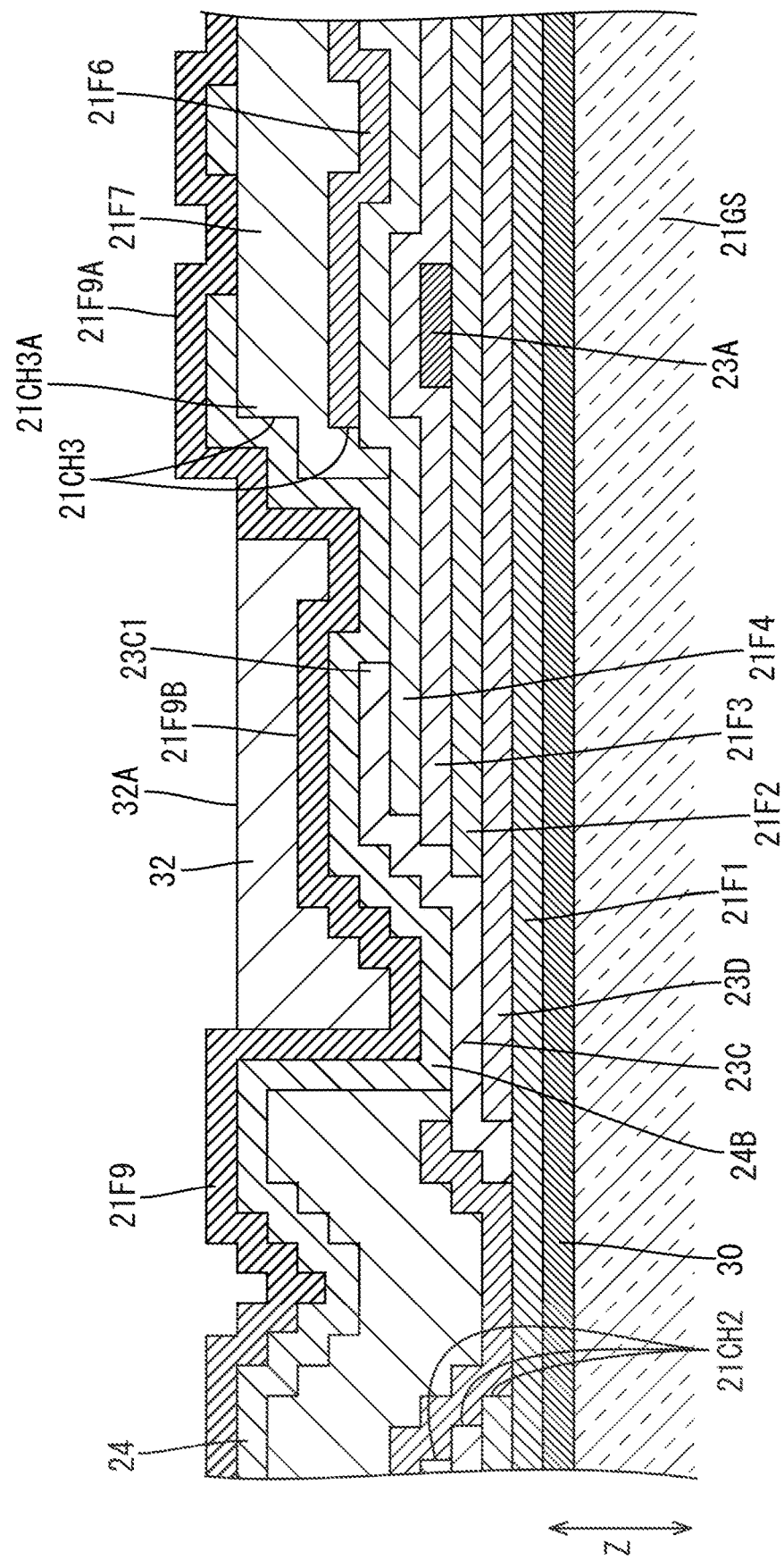
FIG. 15 is a cross-sectional view taken along the same line as that in FIG. 9 and illustrating the second planarization film that is developed after the eleventh step of the method of producing the array substrate.

As illustrated in FIG. 15, the insulation portion 32, which is formed as described above, is included in an upper layer than the fourth interlayer insulation film 21F9 inside the third contact hole 21CH3. With such a configuration, even if a hole is created at the stepped portion of the fourth interlayer insulation film 21F9 due to the film breaking, the hole can be covered with the insulation portion 32. By controlling the light irradiation amount per unit time or the light exposure time in the exposure step, the insulation portions 32 can be easily formed such that the upper surfaces of the insulation portions 32 are lower than the upper surfaces 21F9A of the portions of the fourth interlayer insulation film 21F9 around the third contact holes 21CH3. Since the eleventh step is performed after the tenth step, the second planarization film 21F10 is less likely to be subjected to etching when the fourth interlayer insulation film 21F9 is subjected to patterning. The second planarization film 21F10 is made of organic material that easily creates dust due to etching; however, the second planarization film 21F10 is not subjected to etching and dust is less likely to be created from the second planarization film 21F10.

The twelfth step will be described. In the twelfth step, the fourth metal film 21F11 and a resist film are subsequently disposed in a solid pattern on the second planarization film 21F10 and included in an upper layer than the second planarization film 21F10. Then, the resist film is subjected to exposure through a photomask with an exposure device and the exposed resist film is developed. With the fourth metal film 21F11 being subjected to etching with the developed resist film, the fourth metal film 21F11 is subjected to patterning as illustrated in FIG. 16. As a result, the second light blocking portion 31, which is a portion of the fourth metal film 21F11, is formed. The first conductive sections 31A1 of the first extending portions 31A of the second light blocking portion 31 are disposed on the insulation portions 32 inside the third contact holes 21CH3, respectively, and included in an upper layer than the insulation portions 32. The insulation portions 32 and the fourth interlayer insulation film 21F9 are disposed between the first conductive sections 31A1 and the contact portions 24B of the pixel electrodes 24. With such a configuration, even if a hole is created in the fourth interlayer insulation film 21F9 due to the breaking of the film, the hole can be covered with the insulation portion 32. Therefore, a short-circuit is less likely to be caused between the first conductive section 31A1 and the contact portion 24B.

The thirteenth step will be described. In the thirteenth step, the second transparent electrode film 21F12 and a resist film are subsequently disposed in a solid pattern on the fourth metal film 21F11 and included in an upper layer than the fourth metal film 21F11. Then, the resist film is subjected to exposure through a photomask with an exposure device and the exposed resist film is developed. With the second transparent electrode film 21F12 being subjected to etching with the developed resist film, the second transparent electrode film 21F12 is subjected to patterning as illustrated in FIG. 17. As a result, the common electrode 25, which is a portion of the second transparent electrode film 21F12, is formed. The common electrode 25 is disposed on the second light blocking portion 31 and included in an upper layer than the second light blocking portion 31. The common electrode 25 is electrically connected to the second light blocking portion 31. With the insulation portions 32, short-circuits are less likely to be caused between the common electrode 25 and the contact portions 24B via the second light blocking portion 31. Display errors are caused when the pixel electrode 24 is charged at a same potential as that of the common electrode; however, in this embodiment, such display errors are less likely to be caused.

As described above, the array substrate 21 according to this embodiment includes the TFTs 23 (thin film transistors), the third interlayer insulation film 21F6 and the first planarization film 21F7, which are configured as a first insulation film, the pixel electrodes 24, the fourth interlayer insulation film 21F9 (a second insulation film), the second light blocking portion 31 (a conductive portion), and the insulation portion 32. The TFTs 23 at least include the drain electrodes 23C. The third interlayer insulation film 21F6 and the first planarization film 21F7 are disposed on and included in an upper layer than the drain electrodes 23C and include the third contact holes 21CH3 (the contact holes) in the portions overlapping the drain electrodes 23C. The pixel electrodes 24 are disposed on and included in an upper layer than the third interlayer insulation film 21F6 and the first planarization film 21F7, which are configured as the first insulation film. The pixel electrodes 24 overlap the drain electrodes 23C at least inside the third contact holes 21CH3 and are connected to the drain electrodes 23C, respectively. The fourth interlayer insulation film 21F9 (the second insulation film) is disposed on and included in an upper layer than the pixel electrodes 24. The fourth interlayer insulation film 21F9 overlaps the pixel electrodes 24 inside the third contact holes 21CH3 and extends to the outside of the third contact holes 21CH3. The second light blocking portion 31 (the conductive portion) is disposed on and included in an upper layer than the fourth interlayer insulation film 21F9. The second light blocking portion 31 overlaps the pixel electrodes 24 at least inside the third contact holes 21CH3. The insulation portions 32 are included in an upper layer than the pixel electrodes 24 and in a lower layer than the second light blocking portion 31. The insulation portions 32 overlap the pixel electrodes 24 inside the third contact holes 21CH3.

The pixel electrodes 24, which are connected to the drain electrodes 23C of the TFTs 23 via the third contact holes 21CH3, are insulated from the second light blocking portion 31 by the fourth interlayer insulation film 21F9 that are disposed inside and outside the third contact holes 21CH3. For example, with the edge 23C1 of the drain electrode 23C being disposed inside the third contact hole 21CH3, a stepped portion is created at the portion of the fourth interlayer insulation film 21F9 overlapping the edge 23C1 of the drain electrode 23C due to the edge 23C1 of the drain electrode 23C. At the stepped portion of the fourth interlayer insulation film 21F9, coverage of the fourth interlayer insulation film 21F9 with respect to a base layer lower than the fourth interlayer insulation film 21F9 is deteriorated and the film may be broken. In this respect, the insulation portion 32 is disposed between the pixel electrode 24 and the second light blocking portion 31. Therefore, with the insulation portion 32, even if a hole is created in the fourth interlayer insulation film 21F9 due to the breaking of the fourth interlayer insulation film 21F9, the pixel electrode 24 and the second light blocking portion 31 are less likely to be short-circuited via the hole.

Furthermore, the common electrode 25 is disposed on and included in an upper layer than the second light blocking portion 31. The common electrode 25 at least overlaps the second light blocking portion 31 inside the third contact hole 21CH3 and is connected to the second light blocking portion 31. This suppresses short-circuits between the second light blocking portion 31 and the pixel electrodes 24. Therefore, the common electrode 25, which is connected to the second light blocking portion 31, and the pixel electrodes 24 are less likely to be short-circuited via the second light blocking portion 31.

The second light blocking portion 31 has light blocking properties and is disposed to overlap at least the edges 21CH3A of the third contact holes 21CH3, which are formed in the first planarization film 21F7. The edges 21CH3A are portions of the first planarization film 21F7, which is included in the first insulation film. Thus, the whole third contact hole 21CH3 is covered with the second light blocking portion 31 having light blocking properties and this increases reliability of suppressing leaking of light through the third contact hole 21CH3.

The second light blocking portion 31 is made of metal material and is included in a lower layer than the common electrode 25. Accordingly, the second light blocking portion 31, which is made of metal material, is covered with the common electrode 25 from the upper layer side and the second light blocking portion 31 is less likely to be corroded due to electro corrosion.

The TFTs 23 and the pixel electrodes 24 are arranged in a matrix within a surface area of the array substrate 21. The third interlayer insulation film 21F6 and the first planarization film 21F7, which are included in the first insulation film, include the third contact holes 21CH3 that are arranged in a matrix within the surface area of the array substrate 21. The common electrode 25 is disposed in a solid pattern within the surface area of the array substrate 21 so as to overlap the pixel electrodes 24. The second light blocking portion 31 includes the first conductive sections 31A1 and the second conductive sections 31A2. The first conductive sections 31A1 overlap the pixel electrodes 24, respectively, inside the third contact holes 21CH3. The second conductive sections 31A2 extend between the third contact holes 21CH3 and are continuous to the first conductive sections 31A1. Thus, since the second light blocking portion 31, which is contacted with the common electrode 25, includes the second conductive sections 31A2 that extend between the third contact holes 21CH3 to be continuous to the first conductive sections 31A1, the resistance distribution of the common electrode 25 can be effectively reduced. Since the second conductive section 31A2 is disposed to define each of the two adjacent pixel electrodes 24, the second conductive section 31A2 blocks light from travelling between the two adjacent pixel electrodes 24.

The array substrate 21 further includes the gate lines 26 (the first lines) and the source lines 27 (the second lines). The gate lines 26 extend along the first direction and are arranged at intervals with respect to the second direction, which crosses the first direction, so as to sandwich the pixel electrodes 24 between the gate lines 26. The source lines 27 extend along the second direction to cross the gate lines 26 and are arranged at intervals with respect to the first direction so as to sandwich the pixel electrodes 24 between the source lines 27. The second light blocking portion 31 includes the first extending portions 31A and the second extending portions 31B. The first extending portions 31A extend along the first direction and overlap the gate lines 26. The second extending portions 31B extend along the second direction and overlap the source lines 27 and are continuous to the first extending portions 31A. According to such a configuration, the second light blocking portion 31 is formed in a grid with the first extending portions 31A and the second extending portions 31B that are continuous to each other. This is effective for reducing the resistance distribution of the common electrode 25. Since the first extending portion 31A is disposed to define each of the two pixel electrodes 24 that are adjacent to each other in the second direction, the first extending portion 31A blocks light from travelling between the two pixel electrodes 24 that are adjacent to each other in the second direction. Since the second extending portion 31B is disposed to define each of the two pixel electrodes 24 that are adjacent to each other in the first direction, the second extending portion 31B blocks light from travelling between the two pixel electrodes 24 that are adjacent to each other in the first direction.

The fourth interlayer insulation film 21F9 is included in a lower layer than the insulation portion 32. With such a configuration, the insulation portion 32 does not exist when the fourth interlayer insulation film 21F9 is subjected to patterning. Therefore, the insulation portion 32 is not subjected to etching when the fourth interlayer insulation film 21F9 is subjected to patterning.

The upper surface 32A of the insulation portion 32 is at a lower level than the upper surface 21F9A of the portion of the fourth interlayer insulation film 21F9 around the third contact hole 21CH3. With such a configuration, the insulation portion 32 does not project upward than the upper surface 21F9A of the portion of the fourth interlayer insulation film 21F9 at the hole edge of the third contact hole 21CH3. Therefore, the insulation portion 32 is less likely to be contacted with other components.

The bump portions 33 are included in an upper layer than the second light blocking portion 31 and disposed to overlap at least the second light blocking portion 31 inside the third contact holes 21CH3. The gap is created between the upper surface 32A of the insulation portion 32 and the upper surface 21F9A of the portions of the fourth interlayer insulation film 21F9 at the hole edges of the third contact holes 21CH3. With the bump portions 33 being disposed to overlap portions of the second light blocking portion 31 inside the third contact holes 21CH3, the gap can be compensated.

The insulation portion 32 is made of organic material and thicker than the fourth interlayer insulation film 21F9. A gap is created between the upper surface 21F9A of the portion of the fourth interlayer insulation film 21F9 at the hole edge of the third contact hole 21CH3 and the upper surface 21F9B of the portion of the fourth interlayer insulation film 21F9 inside the third contact hole 21CH3. With the insulation portion 32 that is thicker than the fourth interlayer insulation film 21F9 being disposed inside the third contact hole 21CH3, the gap between the upper surface 21F9A and the upper surface 21F9B is compensated. The insulation portion 32 is made of organic material that easily creates dust due to etching; however, the insulation portion 32 is not subjected to etching when the fourth interlayer insulation film 21F9 is subjected to patterning and dust is less likely to be created from the insulation portion 32.

The liquid crystal panel 11 (the display device) according to this embodiment includes the array substrate 21 and the opposed substrate 20 that is disposed to be opposite the array substrate 21. According to such a display device, short-circuits are less likely to be caused in the array substrate 21 and display errors due to short-circuits are less likely to be caused. This improves display quality.

The method of producing the array substrate 21 according to this embodiment includes disposing the third metal film 21F5 (the first conductive film), forming the drain electrodes 23C of the TFTs 23 by patterning the third metal film 21F5, disposing the third interlayer insulation film 21F6 and the first planarization film 21F7, which are configured as the first insulation film, in an upper layer than the third metal film 21F5, forming the third contact holes 21CH3 in portions of the third interlayer insulation film 21F6 and the first planarization film 21F7 overlapping the drain electrodes 23C by patterning the third interlayer insulation film 21F6 and the first planarization film 21F7, disposing the first transparent electrode film 21F8 (the second conductive film) in an upper layer than the third interlayer insulation film 21F6 and the first planarization film 21F7, which are configured as the first insulation film, providing the pixel electrodes 24 by patterning the first transparent electrode film 21F8 such that the pixel electrodes 24 overlap at least the drain electrodes 23C inside the third contact holes 21CH3 and are connected to the drain electrodes 23C, disposing the fourth interlayer insulation film 21F19 (the second insulation film) in an upper layer than the first transparent electrode film 21F8 such that the fourth interlayer insulation film 21F19 overlaps the pixel electrodes 24 inside the third contact holes 21CH3 and extends outside the third contact holes 21CH3, disposing the second planarization film 21F10 (the third insulation film) in an upper layer than the first transparent electrode film 21F8 and forming the insulation portion 32 by patterning the second planarization film 21F10 such that the insulation portion 32 overlaps the pixel electrodes 24 inside the third contact holes 21CH3, and disposing the fourth metal film 21F11 (the third conductive film) in an upper layer than the fourth interlayer insulation film 21F9 and the second planarization film 21F10 and forming the second light blocking portion 31 that overlaps at least the pixel electrodes 24 inside the third contact holes 21CH3 by patterning the fourth metal film 21F11.

The pixel electrodes 24, which are obtained by patterning the first transparent electrode film 21F8, are connected to the drain electrodes 23C, which are obtained by patterning the third metal film 21F5, via the third contact holes 21CH3, which are formed by patterning the third interlayer insulation film 21F6 and the first planarization film 21F7 (the first insulation film). The pixel electrodes 24 are insulated from the second light blocking portion 31, which is a portion of the fourth metal film 21F11, by the fourth interlayer insulation film 21F9 that is disposed on and included in an upper layer than the first transparent electrode film 21F8. If the edge 23C1 of the drain electrode 23C is disposed inside the third contact hole 21CH3, a stepped portion may be created at the portion of the fourth interlayer insulation film 21F9 overlapping the edge 23C1 of the drain electrode 23C due to the edge 23C1 of the drain electrode 23C. At the stepped portion of the fourth interlayer insulation film 21F9, coverage of the fourth interlayer insulation film 21F9 with respect to a base layer lower than the fourth interlayer insulation film 21F9 is deteriorated and the film may be broken. In this respect, the insulation portion 32, which is a portion of the second planarization film 21F10 included in an upper layer than the pixel electrode 24, is disposed between the pixel electrode 24 and the second light blocking portion 31. Therefore, with the insulation portion 32, even if a hole is created in the fourth interlayer insulation film 21F9 due to the breaking of the fourth interlayer insulation film 21F9, the pixel electrode 24 and the second light blocking portion 31 are less likely to be short-circuited via the hole.

The fourth interlayer insulation film 21F9 is disposed on and included in an upper layer than the first transparent electrode film 21F8, and the second planarization film 21F10, which is made of positive-type photosensitive material, is disposed on and included in an upper layer than the fourth interlayer insulation film 21F9. The disposed second planarization film 21F10 is subjected to exposure with an entire surface thereof and developed. Thus, the insulation portions 32 are obtained. The fourth interlayer insulation film 21F9 is included in an upper layer than the first transparent electrode film 21F8. The portions of the fourth interlayer insulation film 21F9 that are disposed inside the third contact holes 21CH3 are lower than the portions of the fourth interlayer insulation film 21F9 that are disposed outside the third contact holes 21CH3. The portions of the fourth interlayer insulation film 21F9 that are disposed inside the third contact holes 21CH3 are thicker than the portions of the fourth interlayer insulation film 21F9 that are disposed outside the third contact holes 21CH3. The second planarization film 21F10, which is made of positive-type photosensitive material, is subjected to exposure with an entire surface thereof. By controlling the light exposure time, selective exposure as described below can be performed. The portions of the second planarization film 21F10 outside the third contact holes 21CH3 are selectively subjected to exposure with a whole depth of the second planarization film 21F10. Upper surface sections of the portions of the second planarization film 21F10 inside the third contact holes 21CH3 are selectively subjected to exposure. Lower surface sections of the portions of the second planarization film 21F10 inside the third contact holes 21CH3 are not subjected to exposure. With the second planarization film 21F10 being exposed as descried above and developed, the insulation portions 32 that are selectively disposed inside the third contact holes 21CH3 are obtained. Accordingly, the insulation portions 32 can be easily formed such that the upper surfaces 32A of the insulation portions 32 are lower than the upper surfaces 21F9A of the portions of the fourth interlayer insulation film 21F9 around the third contact holes 21CH3. Therefore, the insulation portion 32 does not protrude upward than the upper surfaces 21F9A of the portions of the fourth interlayer insulation film 21F9 around the third contact holes 21CH3 and the insulation portion 32 is less likely to be contacted with other components.

Other Embodiments

The technology described herein is not limited to the embodiments described above and illustrated by the drawings. For example, the following embodiments will be included in the technical scope of the present technology.

(1) The upper surface 32A of the insulation portion 32 may be at a same level as the upper surface 21F9A of the portion of the fourth interlayer insulation film 21F9 around the third contact hole 21CH3.

(2) One, two, or four of the four edges 23C1 of the drain electrode 23C may be disposed inside the third contact hole 21CH3.

(3) All of the four edges 23C1 of the drain electrode 23C may be disposed to overlap the edges 21CH3A of the third contact holes 21CH3 in the third interlayer insulation film 21F6 and the first planarization film 21F7. With such a configuration, in the liquid crystal panel 11 having high resolution, the edge 23C1 of the drain electrode 23C may be disposed inside the third contact hole 21CH3 if a photomask used for patterning is displaced from a correct position. This may create a stepped portion in the fourth interlayer insulation film 21F9 and the fourth interlayer insulation film 21F9 may be broken. In this respect, with the insulation portion 32 being disposed, a short-circuit is less likely to be caused between the second light blocking portion 31 and the pixel electrode 24.

(4) A specific two-dimensional shape of the drain electrodes 23C may be any shapes other than the rectangle as appropriate. With the drain electrodes 23C having a shape other than the rectangle, any of the edges 23C1 of the drain electrode 23C may be disposed inside the third contact hole 21CH3 or any of the edges 23C1 of the drain electrode 23C may be disposed outside the third contact hole 21CH3.

(5) The order of the layers in which the fourth interlayer insulation film 21F9 and the second planarization film 21F10 are disposed may be opposite. Namely, the fourth interlayer insulation film 21F9 may be included in an upper layer than the insulation portion 32.

(6) The order of the layers in which the fourth metal film 21F11 and the second transparent electrode film 21F12 are disposed may be opposite. Namely, the second light blocking portion 31 may be included in an upper layer than the common electrode 25. A protective film may be disposed on and included in an upper layer than the second light blocking portion 31.

(7) The two-dimensional shape and the forming area of the second light blocking portion 31 may be altered as appropriate. For example, the second light blocking portion 31 may not include the second extending portions 31B but may include only the first extending portions 31A (including the first conductive sections 31A1 and the second conductive sections 31A2). The second light blocking portion 31 may include the second extending portions 31B and the first conductive sections 31A1 that are continuous to the second extending portions 31B. The first extending portions 31A and the second extending portions 31B may not extend over an entire area of the display area AA but may be divided into multiple sections. The second light blocking portion 31 may include only the first conductive sections 31A1.

(8) The second light blocking portion 31 may not be included. In such a configuration, portions of the common electrode 25 overlapping the third contact holes 21CH3 may be configured as the conductive portions.

(9) The first metal film and the first light blocking portions 30 may be made of non-electrically conductive material.

(10) The first light blocking portion 30 may not be included.

(11) The two-dimensional shape of the pixel electrodes 24 may be any other shapes other than that illustrated in the drawings. For example, the two-dimensional shape of the pixel electrode bodies 24A of the pixel electrodes 24 may be a square or a parallelogram.

(12) The two-dimensional shape of the openings 25A of the common electrode 25 may be any shapes other than that illustrated in the drawings. For example, the openings 25A of the common electrode 25 may have a linear shape or a curved shape. The pixel electrodes 24 may be disposed such that one pixel electrode 24 overlaps multiple openings 25A of the common electrode 25.

(13) The common electrode 25 may include holes in portions overlapping the first conductive sections 31A1 and the third contact holes 21CH3.

(14) The third interlayer insulation film 21F6 or the first planarization film 21F7, which are configured as the first insulation film, may not be included.

(15) The plan-view pattern of the gate lines 26 and the source lines 27 may be altered as appropriate. For example, the gate lines 26 or the source lines 27 may not extend straight but may extend obliquely with being bent several times.

(16) The specific intervals between the pixels PX and the specific widths of the gate lines 26 and the source lines 27 may be altered as appropriate.

(17) The TFTs 23 may not be top-gate type TFTs but may be bottom-gate type TFTs.

(18) The semiconductor film may be an amorphous silicon thin film or an oxide semiconductor thin film.

(19) The operation mode of the liquid crystal panel 11 may be an in-plane switching (IPS) mode.

(20) The two-dimensional shape of the liquid crystal panel 11 may be a laterally long rectangular shape, a square shape, a circular shape, a semicircular shape, an oval shape, and a trapezoidal shape.

(21) Other than the liquid crystal panel 11, the present technology may be used in an organic EL display panel.

(22) Other than the head-mounted display 10HMD, a head-up display or a projector may be used as a device for magnifying images displayed on the liquid crystal panel 11 using a lens. The present technology may be applied to a display device without having a magnifying display function (such as television devices, tablet-type terminals, and smartphones).

The invention claimed is:

1. An array substrate comprising:
   a thin film transistor at least including a drain electrode;
   a first insulation film included in an upper layer than the drain electrode and including a contact hole in a portion of the first insulation film overlapping the drain electrode;
   a pixel electrode included in an upper layer than the first insulation film and overlapping the drain electrode at least inside the contact hole and being connected to the drain electrode;
   a second insulation film included in an upper layer than the pixel electrode and overlapping the pixel electrode inside the contact hole and extending outside the contact hole;
   a conductive portion included in an upper layer than the second insulation film and overlapping the pixel electrode at least inside the contact hole;
   an insulation portion included in an upper layer than the pixel electrode and in a lower layer than the conductive portion and overlapping the pixel electrode inside the contact hole; and
   a common electrode included in an upper layer than the second insulation film and overlapping the conductive portion at least inside the contact hole and being connected to the conductive portion.

2. The array substrate according to claim 1, wherein the conductive portion has light blocking properties and overlaps at least a portion of the first insulation film at an edge of the contact hole.

3. The array substrate according to claim 2, wherein the conductive portion is made of metal material and included in a lower layer than the common electrode.

4. The array substrate according to claim 3, wherein
   the thin film transistor includes thin film transistors that are arranged in a matrix within a surface area of the array substrate,
   the pixel electrode includes pixel electrodes that are arranged in a matrix within the surface area of the array substrate,
   the contact hole includes contact holes and the first insulation film is disposed such that the contact holes are arranged in a matrix within the surface area of the array substrate,
   the common electrode is disposed in a solid pattern within the surface area of the array substrate so as to overlap the pixel electrodes, and
   the conductive portion includes first conductive sections and second conductive sections, the first conductive sections are disposed to overlap the pixel electrodes inside the contact holes, respectively, and the second conductive sections extend between the contact holes and are continuous to the first conductive sections.

5. The array substrate according to claim 4, further comprising:
   first lines extending along a first direction and being arranged at intervals with respect to a second direction that crosses the first direction and sandwiching the pixel electrodes with respect to the second direction; and
   second lines extending along the second direction and crossing the first lines, the second lines being arranged at intervals with respect to the first direction and sandwiching the pixel electrodes with respect to the first direction, wherein
   the conductive portion includes first extending portions and second extending portions,
   the first extending portions extend along the first direction and overlap the first lines, respectively, and
   the second extending portions extend along the second direction and overlap the second lines, respectively, and are continuous to the first extending portions.

6. The array substrate according to claim 1, wherein the second insulation film is included in a lower layer than the insulation portion.

7. The array substrate according to claim 6, wherein the insulation portion is configured such that an upper surface of the insulation portion is at a lower level than an upper surface of a portion of the second insulation film around the contact hole.

8. The array substrate according to claim 7, further comprising a second insulation portion that is included in an upper layer than the conductive portion and overlaps the conductive portion at least in the contact hole.

9. The array substrate according to claim 6, wherein the insulation portion is made of organic material and is thicker than the second insulation film.

10. A display device comprising:
   the array substrate according to claim 1; and
   an opposed substrate disposed to opposite the array substrate.

11. A method of producing an array substrate comprising steps of:
   disposing a first conductive film and providing a drain electrode of a thin film transistor by patterning the first conductive film;
   disposing a first insulation film on an upper layer-side of the first conductive film and forming a contact hole in a portion of the first insulation film overlapping the drain electrode by patterning the first insulation film;
   disposing a second conductive film on an upper layer-side of the first insulation film and providing a pixel electrode by patterning the second conductive film such that the pixel electrode overlaps the drain electrode at least inside the contact hole and is connected to the drain electrode;
   disposing a second insulation film on an upper layer-side of the second conductive film such that the second insulation film overlaps the pixel electrode inside the contact hole and extending outside the contact hole;
   disposing a third insulation film on an upper layer-side of the second conductive film and providing an insulation portion by patterning the third insulation film such that the insulation portion overlaps the pixel electrode inside the contact hole; and
   disposing a third conductive film on an upper-layer side of the second insulation film and the third insulation film and providing a conductive portion by patterning the third conductive film such that the conductive portion overlaps the pixel electrode at least inside the contact hole.

12. The method according to claim 11, wherein
   disposing the third insulation film made of positive-type photosensitive material on an upper layer-side of the second insulation film, and
   providing the insulation portion by exposing the third insulation film with an entire surface of the third insulation film.

* * * * *